(12) United States Patent
Fukumitsu et al.

(10) Patent No.: US 12,252,393 B2
(45) Date of Patent: Mar. 18, 2025

(54) RESONANCE DEVICE AND RESONANCE DEVICE MANUFACTURING METHOD

(71) Applicant: Murata Manufacturing Co., Ltd., Nagaokakyo (JP)

(72) Inventors: Masakazu Fukumitsu, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 614 days.

(21) Appl. No.: 17/469,561

(22) Filed: Sep. 8, 2021

(65) Prior Publication Data

US 2021/0403316 A1    Dec. 30, 2021

Related U.S. Application Data

(63) Continuation of application No. PCT/JP2020/004014, filed on Feb. 4, 2020.

(30) Foreign Application Priority Data

Jun. 19, 2019   (JP) ................. 2019-113800

(51) Int. Cl.
*B81B 3/00*    (2006.01)
*B81C 1/00*    (2006.01)
(Continued)

(52) U.S. Cl.
CPC ........ *B81B 3/0021* (2013.01); *B81C 1/00269* (2013.01); *H03H 3/02* (2013.01);
(Continued)

(58) Field of Classification Search
CPC ............ B81B 3/0021; B81B 2207/093; B81B 2201/0271; B81C 1/00269; B81C 2203/0118; B81C 2203/019; B81C 2203/036; B81C 2203/037; B81C 2203/035; H03H 3/02; H03H 9/02; H03H 9/24
(Continued)

(56) References Cited

U.S. PATENT DOCUMENTS 5,352,914 A    10/1994 Farb
2018/0048285 A1    2/2018 Nishimura et al.
2018/0127268 A1    5/2018 Fukumitsu et al.

FOREIGN PATENT DOCUMENTS

JP    106163888 A    6/1994
JP    H10242795 A    9/1998
(Continued)

OTHER PUBLICATIONS

Machine English Translation of JPH10242795A Published on Sep. 11, 1998 (Year: 1998).*
(Continued)

*Primary Examiner* — Jorge L Salazar, Jr.
(74) *Attorney, Agent, or Firm* — ArentFox Schiff LLP

(57) ABSTRACT

A resonance device that includes a MEMS substrate including a resonator, an upper lid that seals a vibration space of the resonator, and a ground portion positioned between the MEMS substrate and the upper lid, the ground portion being extended to an inside of the upper lid and electrically connected to the upper lid.

8 Claims, 14 Drawing Sheets

(51) Int. Cl.
  *H03H 3/02* (2006.01)
  *H03H 9/02* (2006.01)
  *H03H 9/24* (2006.01)

(52) U.S. Cl.
  CPC ............... *H03H 9/02* (2013.01); *H03H 9/24* (2013.01); *B81B 2207/093* (2013.01); *B81C 2203/0118* (2013.01); *B81C 2203/019* (2013.01); *B81C 2203/036* (2013.01); *B81C 2203/037* (2013.01)

(58) Field of Classification Search
  USPC .................................. 333/186, 187, 188
  See application file for complete search history.

(56) References Cited

FOREIGN PATENT DOCUMENTS

| | | | |
|---|---|---|---|
| JP | 2001267875 | A | 9/2001 |
| JP | 2005286510 | A | 10/2005 |
| JP | 2009055294 | A | 3/2009 |
| JP | 2013055632 | A | 3/2013 |
| WO | 2016159018 | A1 | 10/2016 |
| WO | 2017047663 | A1 | 3/2017 |

OTHER PUBLICATIONS

International Search Report issued for PCT/JP2020/004014, date of mailing Mar. 31, 2020.
Written Opinion of the International Searching Authority issued for PCT/JP2020/004014, date of mailing Mar. 31, 2020.

* cited by examiner

RESONANCE DEVICE AND RESONANCE DEVICE MANUFACTURING METHOD

CROSS REFERENCE TO RELATED APPLICATIONS

The present application is a continuation of International application No. PCT/JP2020/004014, filed Feb. 4, 2020, which claims priority to Japanese Patent Application No. 2019-113800, filed Jun. 19, 2019, the entire contents of each of which are incorporated herein by reference.

FIELD OF THE INVENTION

The present invention relates to a resonance device and a resonance device manufacturing method.

BACKGROUND OF THE INVENTION

Resonance devices manufactured by using MEMS (Micro Electro Mechanical Systems) technology have been widespread. This device is formed by bonding an upper substrate to a lower substrate having a resonator, for example.

For example, Patent Document 1 discloses a field effect transistor characterized to include a semiconductor substrate having a channel region, a source and a drain formed respectively in the semiconductor substrate on both sides of the channel region, a gate means formed on the channel region, and a carrier channeling means for allowing carriers to flow between the source and the drain only through a surface portion of the channel region. The field effect transistor prevents hot carrier injection, impact ionization and related effects.

For example, Patent Document 2 discloses a resonance device including: a resonator having a lower electrode, a plurality of upper electrodes, and a piezoelectric film formed between the lower electrode and the plurality of upper electrodes; an upper lid having a first surface and a second surface, the first surface being provided while facing the upper electrode of the resonator so as to seal a first surface of the resonator; a lower lid having a first surface and a second surface, the first surface being provided while facing the lower electrode of the resonator so as to seal a second surface of the resonator; a power supply terminal electrically connected to the upper electrode; and a ground terminal provided on the second surface of the upper lid, in which the lower electrode is electrically connected to the ground terminal via the upper lid. This resonance device stabilizes a resonant frequency.

In addition, for example, Patent Document 3 discloses a MEMS device including a lower substrate having an element having wiring on a surface thereof, an upper substrate provided to face the element, and a bonding portion that bonds the lower substrate and the upper substrate around the element, in which the bonding portion includes a first region, a second region, and a third region provided continuously from a portion close to the element to a portion far from the element, at least one of the first region and the third region includes a hypereutectic alloy of one of the first component and the second component having a higher melting point, and the second region includes a eutectic alloy of the first component and the second component. This MEMS device prevents a metal from protruding from a bonding surface of a eutectic bonding.

Patent Document 1: Japanese Unexamined Patent Application Publication No. 6-163888

Patent Document 2: International Publication WO 2016/159018

Patent Document 3: International Publication WO 2017/047663

SUMMARY OF THE INVENTION

In order to reduce a parasitic capacitance of a substrate, it is necessary to ground the substrate. It is also known that aluminum is suitable as a material for reducing ground/contact resistance with a substrate made of a silicon material. On the other hand, aluminum tends to thermally diffuse into the substrate. In consideration of the influence of such thermal diffusion of aluminum on the substrate made of a silicon material, it is necessary to lower an annealing temperature in an annealing treatment for improving the degree of vacuum. Therefore, the annealing temperature is insufficient, and an aluminum layer or the like cannot be sufficiently degassed, so that outgassing occurs and may affect the degree of vacuum.

The present invention has been made in view of the above circumstances, and an object of the present invention is to provide a resonance device and a resonance device manufacturing method capable of achieving reduction in a contact resistance in a substrate and obtaining a good degree of vacuum by suppressing occurrence of outgassing.

A resonance device according to an aspect of the present invention includes a first substrate including a resonator, a second substrate sealed to the first substrate so as to define a vibration space of the resonator, and a first eutectic reaction layer between the first substrate and the second substrate, the first eutectic reaction layer extending to an inside of the second substrate and electrically connected to the second substrate.

A method of manufacturing a resonance device according to another aspect of the present invention includes preparing a first substrate including a resonator and a second substrate capable of sealing to the first substrate to define a vibration space of the resonator, forming a first metal layer around a vibrating portion of the resonator on the first substrate, forming a second metal layer having a component different from a component of the first metal layer at a position of the second substrate that faces the first metal layer, and bonding the first substrate and the second substrate by causing a eutectic reaction between the first metal layer and the second metal layer to generate a first eutectic reaction layer, and such that the first eutectic reaction layer is extended to an inside of the second substrate and electrically connected to the second substrate.

According to the present invention, it is possible to reduce a contact resistance in a substrate and to obtain a good degree of vacuum by suppressing occurrence of outgassing.

DETAILED DESCRIPTION OF THE PREFERRED EMBODIMENTS

Figure 1:
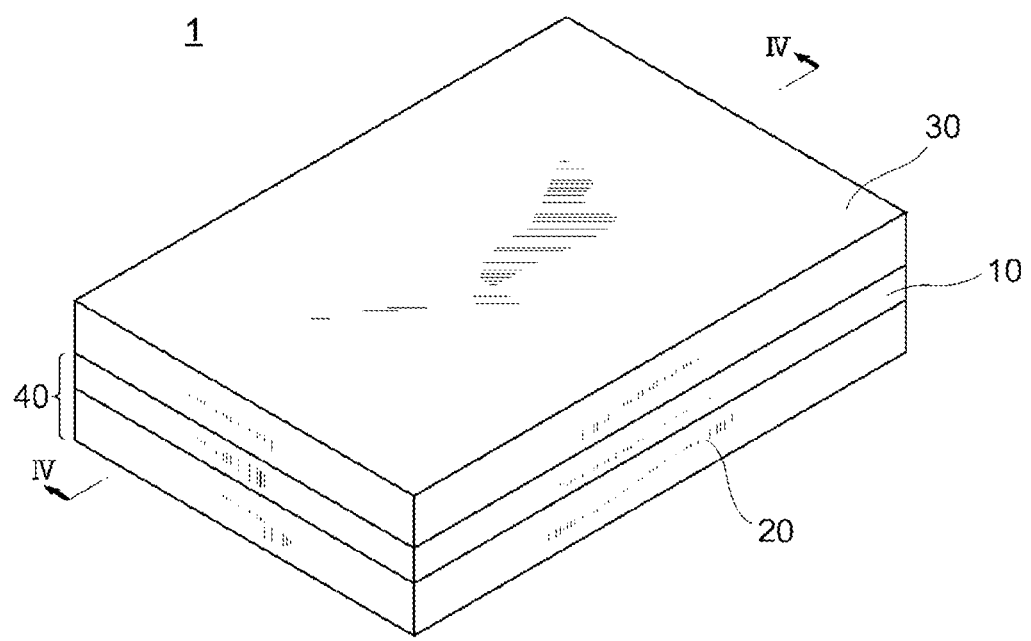
FIG. 1 is a perspective view schematically illustrating an appearance of a resonance device according to an embodiment of the present invention.

Embodiments of the present invention will be described below. In the following description of the drawings, the same or similar components are denoted by the same or similar reference numerals. The drawings are illustrative, and dimensions and shapes of each part are schematic, and the technical scope of the present invention should not be construed as being limited to the embodiments.

EMBODIMENT

<Resonance Device 1>

Figure 2:
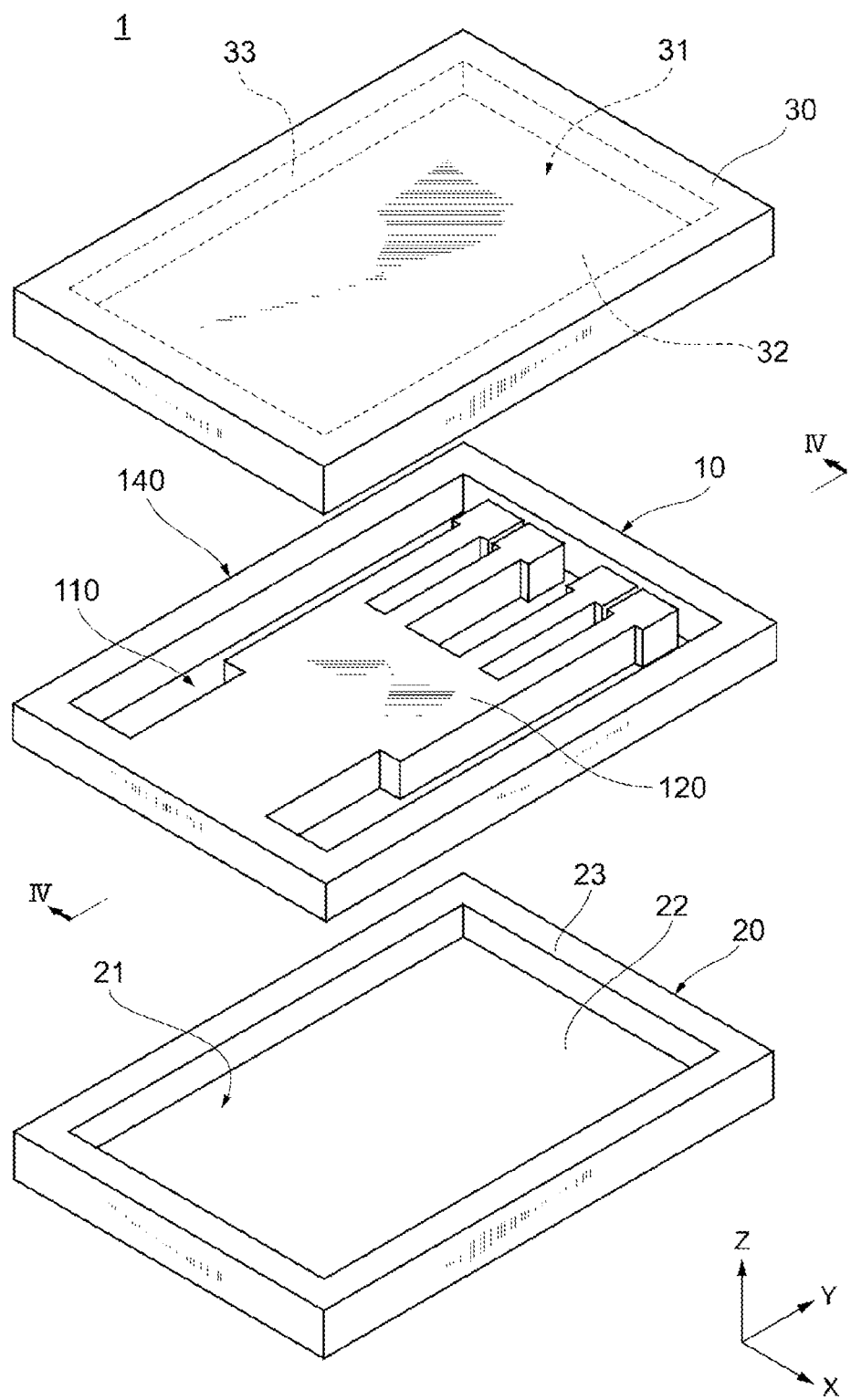
FIG. 2 is an exploded perspective view schematically illustrating a structure of the resonance device illustrated in FIG. 1.

First, a schematic configuration of a resonance device according to an embodiment of the present invention will be described with reference to FIG. 1 and FIG. 2. FIG. 1 is a perspective view schematically illustrating an appearance of a resonance device 1 according to an embodiment of the present invention. FIG. 2 is an exploded perspective view schematically illustrating a structure of the resonance device 1 illustrated in FIG. 1.

The resonance device 1 includes a lower lid 20, a resonator 10 (hereinafter, the lower lid 20 and the resonator 10 may be collectively referred to as a "MEMS substrate 40"), and an upper lid 30. That is, the resonance device 1 is configured by laminating the MEMS substrate 40, the bonding portion 60, and the upper lid 30 in this order. Note that the MEMS substrate 40 is an example of a first substrate, and the upper lid 30 is an example of a second substrate.

Hereinafter, each configuration of the resonance device 1 will be described. Note that in the following description, a side of the resonance device 1 on which the upper lid 30 is provided is referred to as an upper side (or a front side), and a side on which the lower lid 20 is provided is referred to as a lower side (or a back side). In addition, a state in which the MEMS substrate 40 and the upper lid 30 are laminated to configure the resonance device 1 will be described as a "bonded state".

The resonator 10 is a MEMS vibrator manufactured using the MEMS technology. The resonator 10 and the upper lid 30 are bonded with a bonding portion 60 described later interposed therebetween. Further, the resonator 10 and the lower lid 20 are each formed using a silicon (Si) substrate (hereinafter referred to as "Si substrate"), and the Si substrates are bonded to each other. Note that the MEMS substrate 40 (resonator 10 and lower lid 20) may be formed using an SOI substrate.

The upper lid 30 extends in a flat plate shape along an XY plane, and a recess 31 having, for example, a flat rectangular parallelepiped shape is formed on the back surface of the upper lid 30. The recess 31 is surrounded by a side wall 33 and forms a part of a vibration space S in which the resonator 10 vibrates. In addition, a getter layer 34, which will be described later, is formed on a surface of the recess 31 of the upper lid 30 on the resonator 10 side. Note that the upper lid 30 may be configured to have a flat plate shape without the recess 31.

The lower lid 20 includes a rectangular flat plate-shaped bottom plate 22 provided along the XY plane, and a side wall 23 extending from a peripheral edge portion of the bottom plate 22 in a Z-axis direction, that is, in a lamination direction of the lower lid 20 and the resonator 10. In the lower lid 20, a recess 21 formed by a surface of the bottom plate 22 and an inner surface of the side wall 23 is formed on the surface facing the resonator 10. The recess 21 forms a part of the vibration space S of the resonator 10. Note that the lower lid 20 may be configured to have a flat plate shape without the recess 21. In addition, a getter layer may be formed on the surface of the recess 21 of the lower lid 20 on the resonator 10 side.

Figure 3:
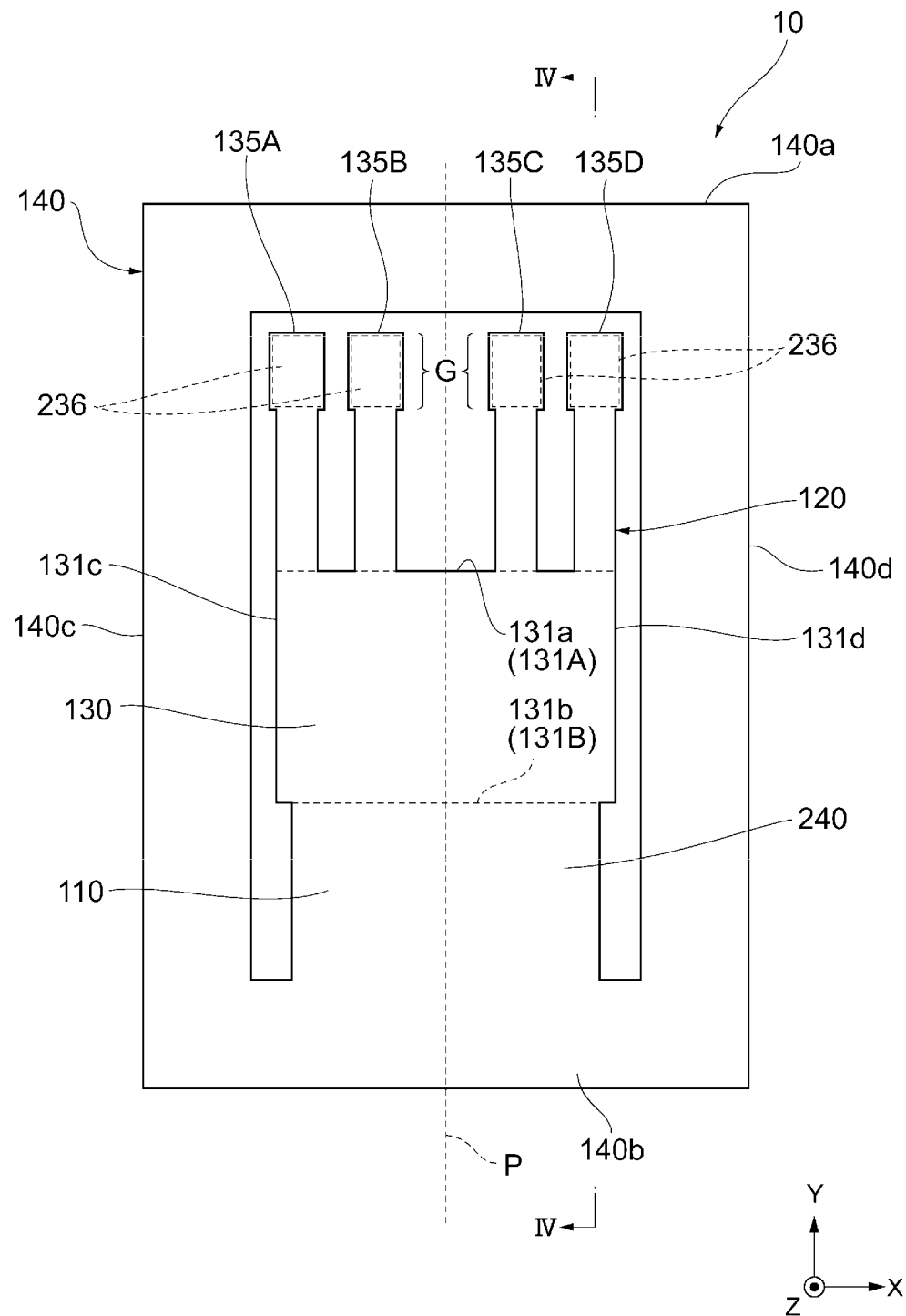
FIG. 3 is a plan view schematically illustrating a structure of a resonator illustrated in FIG. 2.

Next, a schematic configuration of the resonator 10 according to an embodiment of the present invention will be described with reference to FIG. 3. FIG. 3 is a plan view schematically illustrating the structure of the resonator 10 illustrated in FIG. 2.

As illustrated in FIG. 3, the resonator 10 is a MEMS vibrator manufactured using the MEMS technology, and performs out-of-plane vibration in the XY plane in an orthogonal coordinate system of FIG. 3. Note that the resonator 10 is not limited to a resonator using an out-of-plane bending vibration mode. The resonator of the resonance device 1 may use, for example, a spreading vibration mode, a thickness longitudinal vibration mode, a Lamb wave vibration mode, an in-plane bending vibration mode, or a surface acoustic wave vibration mode. These vibrators are applied to, for example, a timing device, an RF filter, a duplexer, an ultrasonic transducer, a gyro sensor, an acceleration sensor, and the like. In addition, these vibrators may be used for a piezoelectric mirror having an actuator function, a piezoelectric gyro, a piezoelectric microphone having a pressure sensor function, an ultrasonic vibration sensor, or the like. Further, these vibrators may be applied to an electrostatic MEMS element, an electromagnetic drive MEMS element, and a piezoresistive MEMS element.

The resonator 10 includes a vibrating portion 120, a holding portion 140, and a holding arm 110.

The holding portion 140 is formed in a rectangular frame shape so as to surround an outside portion of the vibrating portion 120 along the XY plane. For example, the holding portion 140 is integrally formed from a frame body having a prism shape. Note that the holding portion 140 only needs to be provided in at least a part of a circumference of the vibrating portion 120, and the shape thereof is not limited to the frame shape.

The holding arm 110 is provided on an inner side of the holding portion 140 and connects the vibrating portion 120 and the holding portion 140.

The vibrating portion 120 is provided on the inner side of the holding portion 140, and a space is formed at a predetermined interval between the vibrating portion 120 and the holding portion 140. In the example illustrated in FIG. 3, the vibrating portion 120 includes a base portion 130 and four vibrating arms 135A to 135D (hereinafter, also collectively referred to as "vibrating arms 135"). Note that the number of vibrating arms is not limited to four, and is set to an arbitrary number of one or more, for example. In the present embodiment, each of the vibrating arms 135A to 135D and the base portion 130 are integrally formed.

The base portion 130 has long sides 131a and 131b in an X-axis direction and short sides 131c and 131d in a Y-axis direction in a plan view. The long side 131a is one side of a front end surface (hereinafter, also referred to as "front end 131A") of the base portion 130, and the long side 131b is one side of a rear end surface (hereinafter, also referred to as "rear end 131B") of the base portion 130. In the base portion 130, the front end 131A and the rear end 131B are provided so as to face each other.

The base portion 130 is connected to the vibrating arms 135 at the front end 131A, and is connected to the holding arm 110 described later at the rear end 131B. Note that in the example illustrated in FIG. 3, the base portion 130 has a substantially rectangular shape in a plan view, but is not limited thereto. The base portion 130 may be formed substantially plane-symmetrically with respect to a virtual plane P defined along a perpendicular bisector of the long side 131a. For example, the base portion 130 may have a trapezoidal shape in which the long side 131b is shorter than the 131a, or may have a semicircular shape in which the long side 131a is a diameter. In addition, each surface of the base portion 130 is not limited to a flat surface, and may be a curved surface. Note that the virtual plane P is a plane passing through the center of the vibrating portion 120 in a direction in which the vibrating arms 135 are arranged.

In the base portion 130, a base portion length which is the longest distance between the front end 131A and the rear end 131B in a direction from the front end 131A toward the rear end 131B is about 35 µm. In addition, a base portion width, which is the longest distance between the side ends of the base portion 130, is a width direction orthogonal to a base portion length direction, and is about 265 µm.

The vibrating arms 135 extend in the Y-axis direction and each have the same size. Each of the vibrating arms 135 is provided between the base portion 130 and the holding portion 140 in parallel with the Y-axis direction, one end thereof is connected to the front end 131A of the base portion 130 to be a fixed end, and the other end thereof is an open end. In addition, each of the vibrating arms 135 is provided in parallel at a predetermined interval in the X-axis direction. Note that the vibrating arms 135 have a width of about 50 µm in the X-axis direction and a length of about 465 µm in the Y-axis direction, for example.

In each of the vibrating arms 135, for example, a portion having a distance of about 150 µm from the open end is wider in the X-axis direction than other portions of the vibrating arms 135. This widened portion is called a weight portion G. The weight portion G is, for example, wider than the other portions of the vibrating arms 135 by 10 µm to the right and left along the X-axis direction, and the width in the X-axis direction is about 70 µm. The weight portion G is integrally formed by the same process as the vibrating arm 135. Since the weight portion G is formed, a weight per unit length of the vibrating arms 135 is heavier on the open end side than on the fixed end side. Therefore, each of the vibrating arms 135 has the weight portion G on the open end side, so that it is possible to increase an amplitude of vibration in an up-down direction in each vibrating arm.

A protective film 235, which will be described later, is formed on a surface of the vibrating portion 120 (a surface facing the upper lid 30) so as to cover the entire surface thereof. In addition, a frequency adjustment film 236 is formed on a surface of the protective film 235 at each of tips on the open end sides of the vibrating arms 135A to 135D. A resonant frequency of the vibrating portion 120 can be adjusted by the protective film 235 and the frequency adjustment film 236.

Note that in the present embodiment, substantially the entire surface of the surface of the resonator 10 (a surface facing the upper lid 30) is covered with the protective film 235. Further, substantially the entire surface of the protective film 235 is covered with a parasitic capacitance reducing film 240. However, the protective film 235 only needs to cover at least the vibrating arms 135, and is not limited to a configuration of covering substantially the entire surface of the resonator 10.

Figure 4:
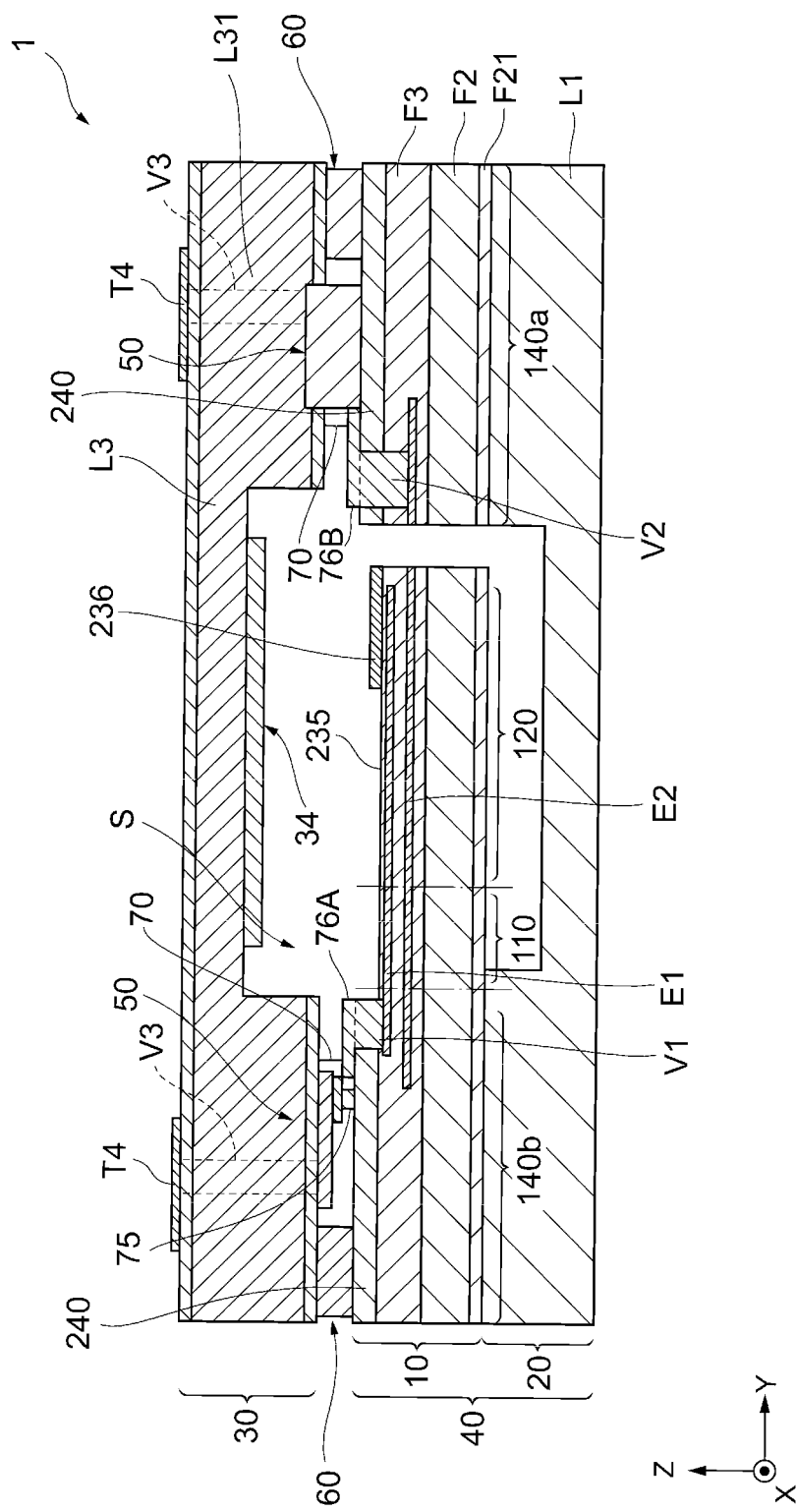
FIG. 4 is a cross-sectional view schematically illustrating a configuration of a cross section taken along a line IV-IV of the resonance device illustrated in FIG. 1 to FIG. 3.

Next, with reference to FIG. 2 to FIG. 4, a laminated structure of the resonance device 1 according to an embodiment of the present invention will be described. FIG. 4 is a cross-sectional view schematically illustrating a configuration of a cross section taken along a line IV-IV of the resonance device 1 illustrated in FIG. 1 to FIG. 3.

In the resonance device 1, the holding portion 140 of the resonator 10 is bonded onto the side wall 23 of the lower lid 20, and further, the holding portion 140 of the resonator 10 and the side wall 33 of the upper lid 30 are bonded by the bonding portion 60. In this manner, the resonator 10 is held between the lower lid 20 and the upper lid 30, and the vibration space S in which the vibrating arms 135 vibrate is formed by the lower lid 20, the upper lid 30, and the holding portion 140 of the resonator 10. In addition, the upper lid 30 is grounded by a ground portion 50. A terminal T4 is formed on an upper surface (a surface opposite to a surface facing the resonator 10) of the upper lid 30. The terminal T4 and the resonator 10 are electrically connected by a through-electrode V3, a connection wiring 70, and contact electrodes 76A and 76B.

The upper lid 30 is formed of a silicon (Si) wafer (hereinafter referred to as "Si wafer") L3 having a predetermined thickness. The upper lid 30 is bonded to the holding portion 140 of the resonator 10 at a peripheral portion (side wall 33) of the upper lid 30 by the bonding portion 60 described later. The front and back surfaces of the upper lid 30 facing the resonator 10 and a side surface of the through-electrode V3 are preferably covered with a silicon oxide film L31. The silicon oxide film L31 is an example of an insulating layer, and is formed on the Si wafer L3 by, for example, oxidation of a surface of the Si wafer L3 or chemical vapor deposition (CVD).

In addition, the getter layer 34 is formed on the surface of the recess 31 of the upper lid 30 on the side facing the resonator 10. The getter layer 34 is formed of, for example, titanium (Ti) or the like, and adsorbs a released-gas generated in the vibration space S. In the upper lid 30 according to the present embodiment, since the getter layer 34 is formed on substantially the entire surface of the surface of the recess 31 facing the resonator 10, it is possible to suppress a decrease in the degree of vacuum of the vibration space S.

In addition, the through-electrode V3 of the upper lid 30 is formed by filling a through-hole formed in the upper lid 30 with a conductive material. The conductive material to be filled is, for example, impurity-doped polycrystalline silicon (Poly-Si), copper (Cu), gold (Au), impurity-doped single crystal silicon, or the like. The through-electrode V3 serves as a wiring that electrically connects the terminal T4 and a voltage application portion 141.

The bottom plate 22 and the side wall 23 of the lower lid 20 are integrally formed by a Si wafer L1. In addition, the lower lid 20 is bonded to the holding portion 140 of the resonator 10 by an upper surface of the side wall 23. A thickness of the lower lid 20 defined in the Z-axis direction is, for example, 150 μm, and a depth of the recess 21 is, for example, 50 μm. Note that the Si wafer L1 is made of non-degenerated silicon and has a resistivity of, for example, equal to or more than 16 m Ω·cm.

The holding portion 140, the base portion 130, the vibrating arms 135, and the holding arm 110 in the resonator 10 are integrally formed in the same process. In the resonator 10, a piezoelectric thin film F3 is formed on a silicon (Si) substrate (hereinafter, referred to as "Si substrate") F2, which is an example of a substrate, so as to cover the Si substrate F2, and a metallic layer E2 is laminated on the piezoelectric thin film F3. Then, the piezoelectric thin film F3 is laminated on the metallic layer E2 so as to cover the metallic layer E2, and a metallic layer E1 is laminated on the piezoelectric thin film F3. The protective film 235 is laminated on the metallic layer E1 so as to cover the metallic layer E1, and the parasitic capacitance reducing film 240 is laminated on the protective film 235.

The Si substrate F2 is formed of, for example, a degenerated n-type silicon (Si) semiconductor having a thickness of about 6 μm, and may contain phosphorus (P), arsenic (As), antimony (Sb), or the like as an n-type dopant. The degenerated silicon (Si) used in the Si substrate F2 has a resistance value of, for example, less than 16 m Ω·cm, and more preferably equal to or less than 1.2 m Ω·cm. Further, on a lower surface of the Si substrate F2, a silicon oxide (for example, $SiO_2$) layer F21 is formed as an example of a temperature characteristic correction layer. This makes it possible to improve temperature characteristics. Note that the silicon oxide layer F21 may be formed on an upper surface of the Si substrate F2, or may be formed on both the upper surface and the lower surface of the Si substrate F2.

In addition, the metallic layers E1 and E2 have a thickness of about 0.1 μm to 0.2 μm, for example, and are patterned into a desired shape by etching or the like after film formation. The metallic layers E1 and E2 are made of metals having a body-centered cubic structure as a crystal structure. Specifically, the metallic layers E1 and E2 are formed by using Mo (molybdenum), tungsten (W) or the like.

The metallic layer E1 is formed so as to serve as an upper electrode, for example, on the vibrating portion 120. In addition, the metallic layer E1 is formed so as to serve as a wiring for connecting the upper electrode to an AC power supply provided outside the resonator 10, on the holding arm 110 and the holding portion 140.

On the other hand, the metallic layer E2 is formed so as to serve as a lower electrode, on the vibrating portion 120. In addition, the metallic layer E2 is formed so as to serve as a wiring for connecting the lower electrode to a circuit provided outside the resonator 10, on the holding arm 110 and the holding portion 140.

The piezoelectric thin film F3 is a thin film of a piezoelectric body that converts an applied voltage into vibration. The piezoelectric thin film F3 is formed of a material having a wurtzite type hexagonal crystal structure as a crystal structure, and may be mainly composed of nitrides or oxides such as aluminum nitride (AlN), scandium aluminum nitride (ScAlN), zinc oxide (ZnO), gallium nitride (GaN), indium nitride (InN) and the like, for example. Note that scandium aluminum nitride is obtained from aluminum nitride in which part of aluminum is substituted with scandium, and instead of scandium, may be substituted with two elements such as magnesium (Mg) and niobium (Nb), magnesium (Mg) and zirconium (Zr) or the like. In addition, the piezoelectric thin film F3 has a thickness of, for example, 1 μm, but may have a thickness of about 0.2 μm to 2 μm.

The piezoelectric thin film F3 expands and contracts in an in-plane direction of the XY plane, that is, in the Y-axis direction according to an electric field applied to the piezoelectric thin film F3 by the metallic layers E1 and E2. By the expansion and contraction of the piezoelectric thin film F3, the vibrating arms 135 displace free ends thereof toward inner surfaces of the lower lid 20 and the upper lid 30, and vibrate in an out-of-plane bending vibration mode.

In the present embodiment, phases of electric fields applied to the outer vibrating arms 135A and 135D and phases of electric fields applied to the inner vibrating arms 135B and 135C are set to be opposite to each other. Accordingly, the outer vibrating arms 135A and 135D and the inner vibrating arms 135B and 135C are displaced in directions opposite to each other. For example, when the outer vibrating arms 135A and 135D displace the free ends toward the inner surface of the upper lid 30, the inner vibrating arms 135B and 135C displace the free ends toward the inner surface of the lower lid 20.

The protective film 235 prevents oxidation of the metallic layer E2 which is the upper electrode for piezoelectric vibration. The protective film 235 is preferably formed using a material whose mass reduction rate by etching is lower than that of the frequency adjustment film 236. The mass reduction rate is expressed by the etching rate, that is, the product of the thickness removed per unit time and the density. The protective film 235 is formed of, for example, an insulating film such as silicon nitride (SiN), silicon oxide ($SiO_2$), alumina oxide ($Al_2O_3$) or the like, other than a piezoelectric film such as aluminum nitride (AlN), scandium aluminum nitride (ScAlN), zinc oxide (ZnO), gallium nitride (GaN), indium nitride (InN) or the like. A thickness of the protective film 235 is, for example, about 0.2 μm.

The frequency adjustment film 236 is formed on substantially the entire surface of the vibrating portion 120, and then formed only in a predetermined region by processing such as etching. The frequency adjustment film 236 is formed of a material whose mass reduction rate by etching is higher than that of the protective film 235. Specifically, the frequency adjustment film 236 is made of a metal such as molybdenum (Mo), tungsten (W), gold (Au), platinum (Pt), nickel (Ni), titanium (Ti) or the like.

Note that the magnitude relationship between the etching rates of the protective film 235 and the frequency adjustment film 236 is arbitrary as long as the relationship between the mass reduction rates is as described above.

The parasitic capacitance reducing film 240 is an example of an insulating layer and is formed of tetraethyl orthosilicate (TEOS). A thickness of the parasitic capacitance reducing film 240 is about 1 μm. The parasitic capacitance reducing film 240 reduces parasitic capacitance in a lead-out wiring portion, and has a function as an insulating layer when wirings having different potentials cross each other and a function as a stand-off for expanding the vibration space S.

The connection wiring 70 is electrically connected to the terminal T4 via the through-electrode V3, and is electrically connected to the contact electrodes 76A and 76B.

The contact electrode 76A is formed so as to be in contact with the metallic layer E1 of the resonator 10, and electrically connects the connection wiring 70 and the resonator 10. The contact electrode 76B is formed so as to be in contact with the metallic layer E2 of the resonator 10, and electrically connects the connection wiring 70 and the resonator 10. To be specific, when the contact electrode 76A and the metallic layer E1 are connected, the piezoelectric thin film F3, the protective film 235, and the parasitic capacitance reducing film 240 laminated on the metallic layer E1 are partially removed so that the metallic layer E1 is exposed, thereby forming a via V1. An inside of the formed via V1 is filled with the same material as that of the contact electrode 76A, and the metallic layer E1 and the contact electrode 76A are connected. Similarly, when the contact electrode 76B and the metallic layer E2 are connected, the piezoelectric thin film F3 and the parasitic capacitance reducing film 240 laminated on the metallic layer E2 are partially removed so that the metallic layer E2 is exposed, thereby forming a via V2. An inside of the formed via V2 is filled with the contact electrode 76B, and the metallic layer E2 and the contact electrode 76B are connected. The contact electrodes 76A and 76B are made of metals such as aluminum (Al), gold (Au), tin (Sn) and the like, for example. Note that a connection point between the metallic layer E1 and the contact electrode 76A and a connection point between the metallic layer E2 and the contact electrode 76B are preferably regions in an outer side portion of the vibrating portion 120, and are connected by the holding portion 140 in the present embodiment.

The bonding portion 60 is an example of a second eutectic reaction layer, and is, for example, an alloy layer formed by a eutectic reaction of a plurality of metals (i.e., a eutectic reaction product of the plurality of metals). The bonding portion 60 is provided between the MEMS substrate 40 and the upper lid 30 so as to be in contact with the MEMS substrate 40 and the upper lid 30. In addition, when viewed in a plan view, the bonding portion 60 is formed in a rectangular ring shape along the XY plane around the vibrating portion 120 of the resonator 10, for example, on the holding portion 140.

In addition, the bonding portion 60 bonds the MEMS substrate 40 and the upper lid 30 so as to seal the vibration space S of the resonator 10. In the bonded state, the bonding portion 60 is connected to the upper lid 30 in an insulating manner via the silicon oxide film L31 provided in the upper lid 30. In addition, the bonding portion 60 is connected to the MEMS substrate 40 in an insulating manner via the parasitic capacitance reducing film 240 provided in the MEMS substrate 40.

In this way, the vibration space S is air-tightly sealed by the bonding of the bonding portion 60, and the vacuum state of the vibration space S is maintained. In addition, the airtightness of the bonding of the bonding portion 60 affects the degree of vacuum of the vibration space S. The degree of vacuum of the vibration space S according to the present embodiment is ensured to be about 1 Pa to 2 Pa due to the high airtightness of the bonding of the bonding portion 60. Note that details of the bonding portion 60 will be described later together with the detailed description of a ground portion 50.

The ground portion 50 is an example of a first eutectic reaction layer, and is, for example, an alloy layer formed by a eutectic reaction of a plurality of metals. The ground portion 50 according to the present embodiment has the same component (material) as the bonding portion 60. The ground portion 50 is provided between the MEMS substrate 40 and the upper lid 30 so as to be in contact with the MEMS substrate 40 and the upper lid 30. In addition, the ground portion 50 is provided around the vibrating portion 120 of the resonator 10 and on an inner side of the bonding portion 60 without being in contact with the bonding portion 60. The shape of the ground portion 50 in the XY plane may be any shape, and is, for example, a rectangular shape.

Further, in the bonded state, similarly to the bonding portion 60, the ground portion 50 is connected to the MEMS substrate 40 in an insulating manner via the parasitic capacitance reducing film 240 provided in the MEMS substrate 40. On the other hand, unlike the bonding portion 60, since a part of the silicon oxide film L31 at a position where the upper lid 30 is connected to the ground portion 50 is removed, the ground portion 50 is extended to an inside of the upper lid 30 and is electrically connected to the upper lid 30.

In this way, the ground portion 50 grounds the upper lid 30, reduces the contact resistance with the upper lid 30, and achieves reduction in the parasitic capacitance of the upper lid 30. Note that the details of the ground portion 50 will be described later.

<Laminated Structure of Ground Portion 50 and Bonding Portion 60>

Figure 5:
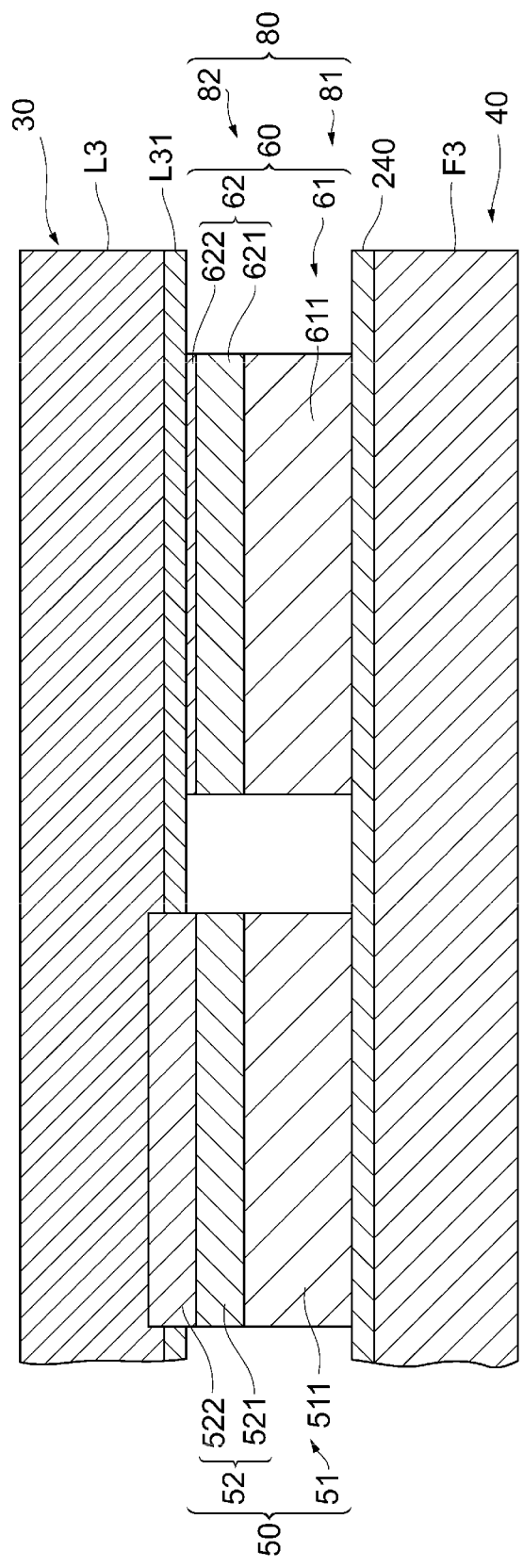
FIG. 5 is an enlarged cross-sectional view of a main part schematically illustrating a configuration of a bonding portion illustrated in FIG. 4.

Next, with reference to FIG. 5, a laminated structure of the ground portion 50 and the bonding portion 60 according to an embodiment of the present invention will be described. FIG. 5 is an enlarged cross-sectional view of a main part schematically illustrating a configuration of the ground portion 50 and the bonding portion 60 illustrated in FIG. 4. In addition, in the example illustrated in FIG. 5, for convenience of description, three metal layers for generating the ground portion 50 and the bonding portion 60, that is, a eutectic reaction layer 80 before the bonding by the eutectic reaction are each illustrated as independent layers, but actually, the interfaces thereof are eutectic-bonded.

Here, in the present embodiment, the ground portion 50 and the bonding portion 60 have the same components. In addition, as described above, the difference between the ground portion 50 and the bonding portion 60 is that, in the bonded state, the ground portion 50 is extended to an inside of the upper lid 30 and is electrically connected to the upper lid 30, but the bonding portion 60 is connected to the upper lid 30 in an insulating manner by the silicon oxide film L31 provided in the upper lid 30. Therefore, in the following description, the configuration of the ground portion 50 will be mainly described, and the description of the configuration of the bonding portion 60 will be simplified.

As illustrated in FIG. 5, the ground portion 50 includes a first ground portion 51 and a second ground portion 52 in this order from the MEMS substrate 40 toward the upper lid 30. The first ground portion 51 includes an aluminum layer 511. The second ground portion 52 includes a germanium layer 521 and a titanium layer 522.

The aluminum layer 511 of the first ground portion 51 is provided on the parasitic capacitance reducing film 240 of the MEMS substrate 40, and is connected to the MEMS substrate 40 in an insulating manner. The titanium layer 522 of the second ground portion 52 is provided in a portion where a part of the silicon oxide film L31 of the upper lid 30 is removed, and is electrically connected to the upper lid 30. The germanium layer 521 of the second ground portion 52 is provided on the titanium layer 522 (under the titanium layer 522 in FIG. 5).

In addition, in the display of FIG. 5, although the titanium layer 522 appears to be extended to an inside of the upper lid 30, in actually, not the titanium layer 522 but an AlGeTi alloy layer generated by the eutectic reaction of the aluminum layer 511, the germanium layer 521, and the titanium layer 522 is extended to the inside of the upper lid 30. That is, the aluminum component is diffused to the inside of the upper lid 30. In this manner, the ground portion 50 grounds the upper lid 30, thereby achieving reduction in the contact resistance of the upper lid 30.

Similarly, the bonding portion 60 is a eutectic reaction layer containing an AlGeTi alloy as a main component, and includes a first bonding portion 61 and a second bonding portion 62 in this order from the MEMS substrate 40 toward the upper lid 30. The first bonding portion 61 includes an aluminum layer 611. In addition, the second bonding portion 62 includes a germanium layer 621 and a titanium layer 622. The titanium layer 622 is provided on the silicon oxide film L31 of the upper lid 30, and the germanium layer 621 is provided on the titanium layer 622 (under the titanium layer 622 in FIG. 5).

In addition, the ground portion 50 and the bonding portion 60 configure the eutectic reaction layer 80. Specifically, the first ground portion 51 and the first bonding portion 61 on the MEMS substrate 40 side configure a first metal layer 81, and the second ground portion 52 and the second bonding portion 62 on the upper lid 30 side configure a second metal layer 82. The first metal layer 81 and the second metal layer 82 configure the eutectic reaction layer 80.

In the present embodiment, a thickness of the aluminum layers 511 and 611 is preferably about 0.70 μm and a thickness of the germanium layers 521 and 621 is preferably about 0.38 μm in order to cause aluminum, germanium, and titanium to sufficiently have the eutectic reaction. In addition, since the titanium layers 522 and 622 function as a close contact layer for causing the germanium layers 521 and 621 to come into close contact with the upper lid 30, a thickness of the titanium layers 522 and 622 does not affect the eutectic reaction. Thus, the thickness of the titanium layers 522 and 622 may be an arbitrary thickness, for example, about 0.10 μm.

In addition, in the present embodiment, since the aluminum layers 511 and 611 are not originally provided on the upper lid 30 side, a concentration of aluminum of the ground portion 50 and the bonding portion 60 on the upper lid 30 side is lower than a concentration of aluminum on the MEMS substrate 40 side in a case where the eutectic reaction is not completely generated or in a case where an amount of aluminum is equal to or more than an amount necessary for the eutectic reaction. On the other hand, in a case where the eutectic reaction has been completely generated, the concentration of aluminum of the ground portion 50 and the bonding portion 60 on the upper lid 30 substrate side is the same as the concentration of aluminum on the MEMS substrate 40 side.

<State of Ground Portion 50 and Bonding Portion 60>

Figure 6:
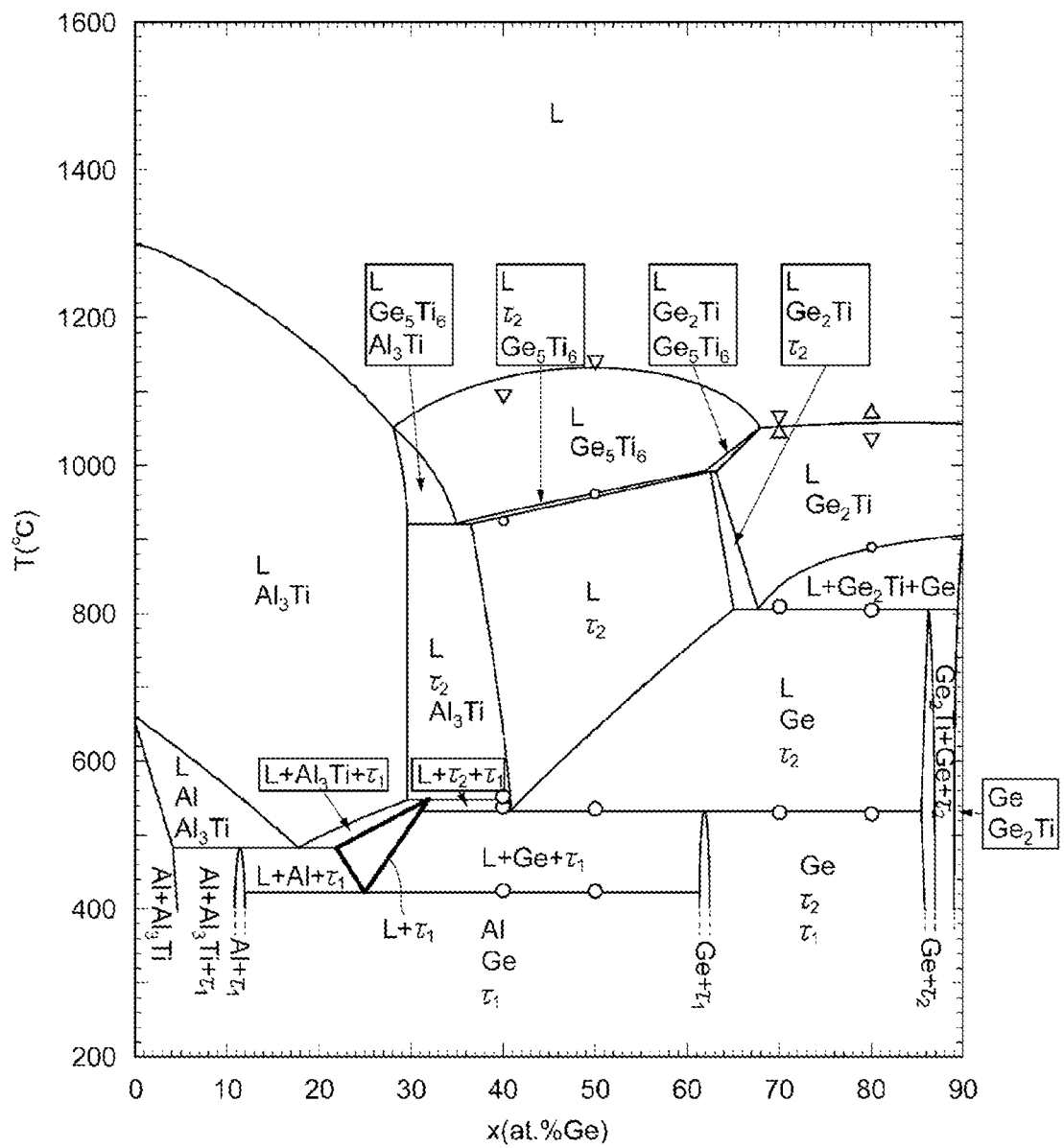
FIG. 6 is a phase diagram when three elements of aluminum (Al), germanium (Ge), and titanium (Ti) are made to have a eutectic reaction.

Next, with reference to FIG. 6, a state of the ground portion 50 and the bonding portion 60 according to the embodiment of the present invention, that is, a state of the eutectic reaction layer 80 will be described. FIG. 6 is a phase diagram when three elements of aluminum (Al), germanium (Ge), and titanium (Ti) are made to have a eutectic reaction. In FIG. 6, a horizontal axis represents a rate (at %) of germanium (Ge), and a vertical axis represents a temperature (° C.).

On the other hand, in a case where three elements, for example, aluminum (Al), germanium (Ge), and titanium (Ti) are made to have the eutectic reaction and bonded, a liquid of eutectic molten metal (denoted by L in FIG. 6) and an aluminum-germanium-titanium alloy (AlGeTi alloy) (denoted by τ1 in FIG. 6) are generated in a range surrounded by a thick line illustrated in FIG. 6. Thus, in a given ternary eutectic reaction, an alloy can be formed and no interface of different materials is formed.

Accordingly, the formation of an interface of different materials is suppressed by the alloy layer made of aluminum (Al), germanium (Ge), and titanium (Ti) in the ground portion 50 and the bonding portion 60. Therefore, voids and interface peeling that may occur in the ground portion 50 and the bonding portion 60 are reduced, and the airtightness and the bonding strength of the ground portion 50 and the bonding portion 60 can be improved.

In addition, when the ground portion 50 or the bonding portion 60 is generated, as described above, since a solid alloy is formed together with the eutectic molten metal which is liquid at a eutectic point or higher, the fluidity of the eutectic molten metal decreases, and the protrusion (splash) of the eutectic molten metal in a planar direction is suppressed. Therefore, it is possible to reduce a short circuit caused by the protrusion of the bonding portion 60, and it is possible to improve the degree of freedom of the layout of the resonance device 1.

It is preferable that each component of the ground portion 50 or the bonding portion 60 have a predetermined concentration rate. For example, the concentration of aluminum (Al) is preferably 58 at % to 82 at %, the concentration of germanium (Ge) is preferably 10 at % to 32 at %, and the concentration of titanium (Ti) is preferably 7 at % to 32 at %. Accordingly, it is possible to easily realize the ground portion 50 or the bonding portion 60 with improved airtightness and bonding strength.

In addition, each component of the ground portion 50 or the bonding portion 60 preferably has a predetermined concentration ratio. For example, the concentration ratio of aluminum (Al), germanium (Ge), and titanium (Ti) is preferably 3:1:1. This further suppresses the formation of an interface of different materials in the ground portion 50 or the bonding portion 60.

<Manufacturing Steps of Resonance Device 1>

Figure 7:
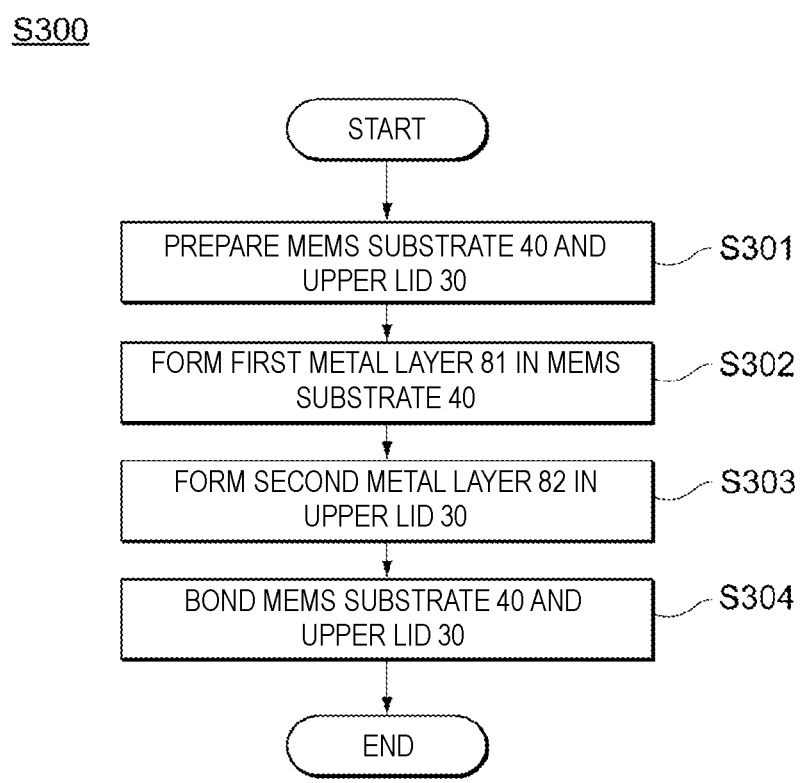
FIG. 7 is a flowchart illustrating a resonance device manufacturing method according to an embodiment of the present invention.
Figure 8:
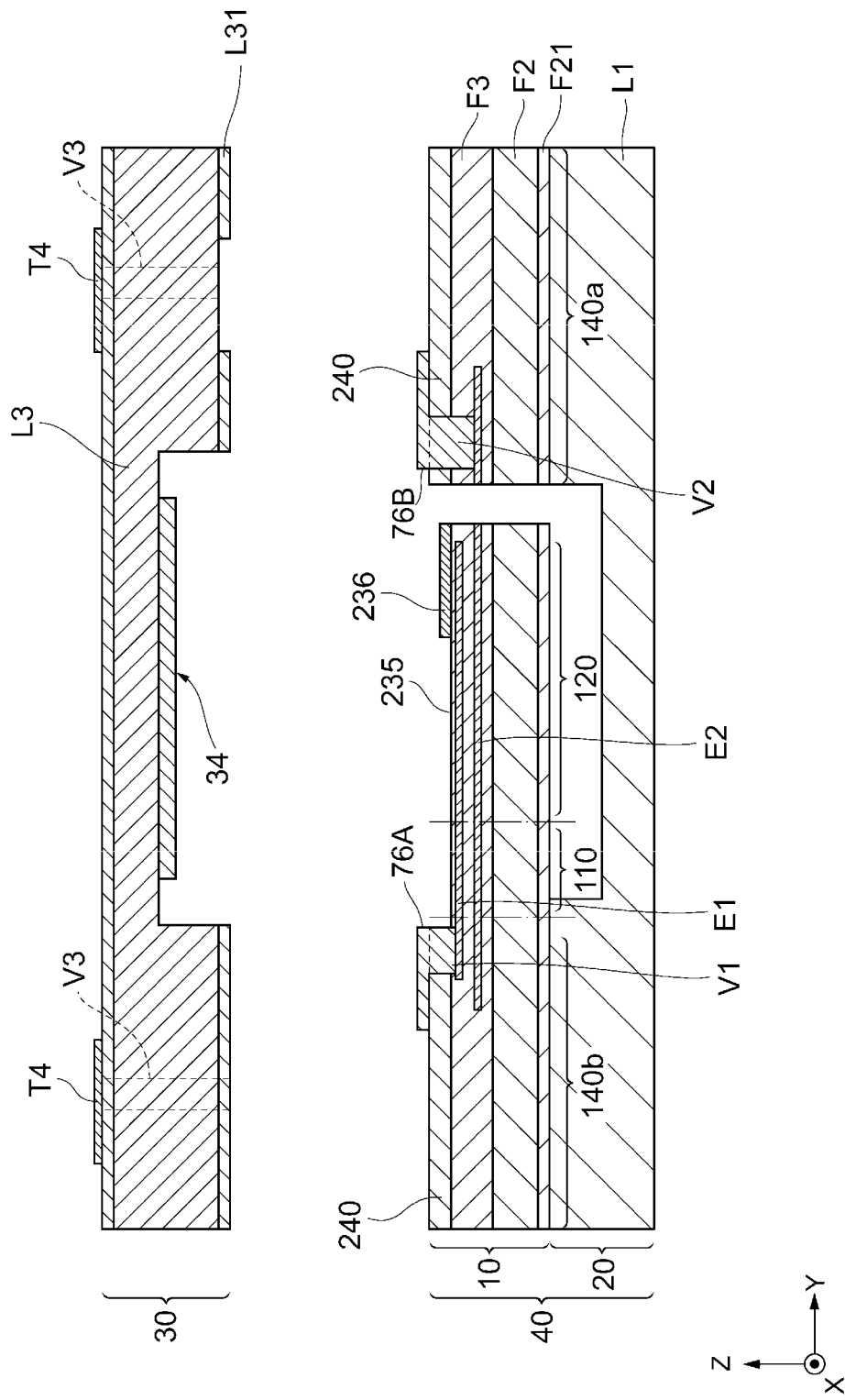
FIG. 8 is a cross-sectional view illustrating a step illustrated in FIG. 7.
Figure 9:
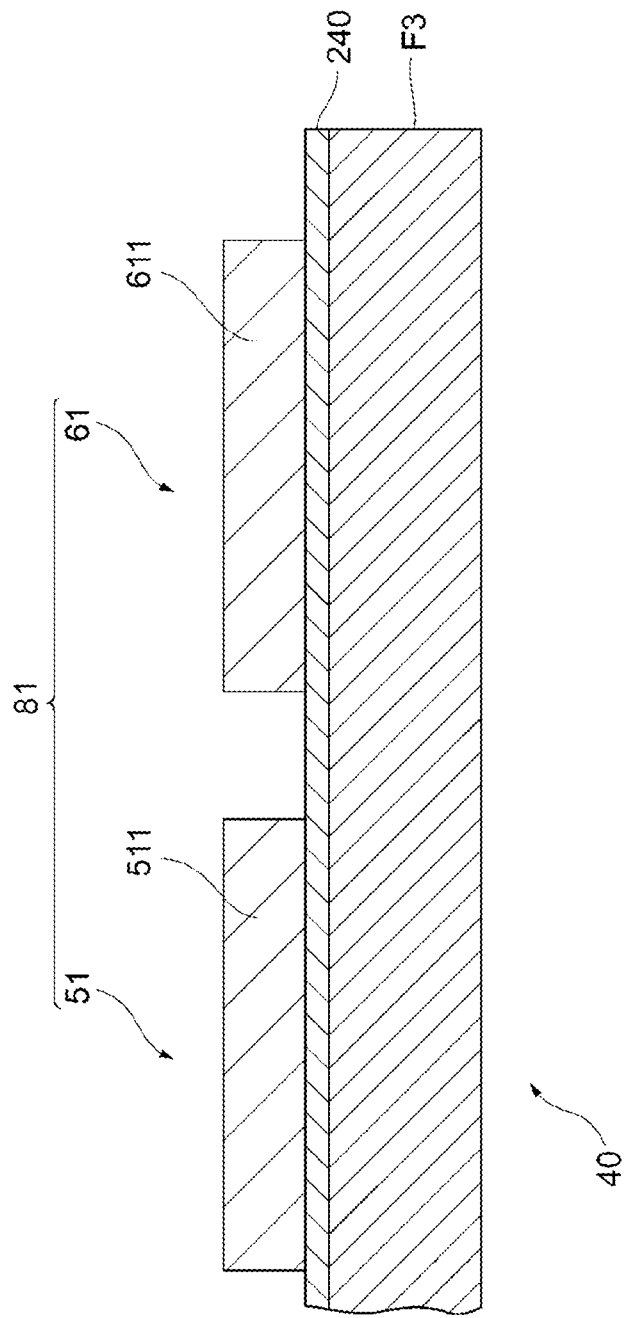
FIG. 9 is a cross-sectional view illustrating a step illustrated in FIG. 7.
Figure 10:
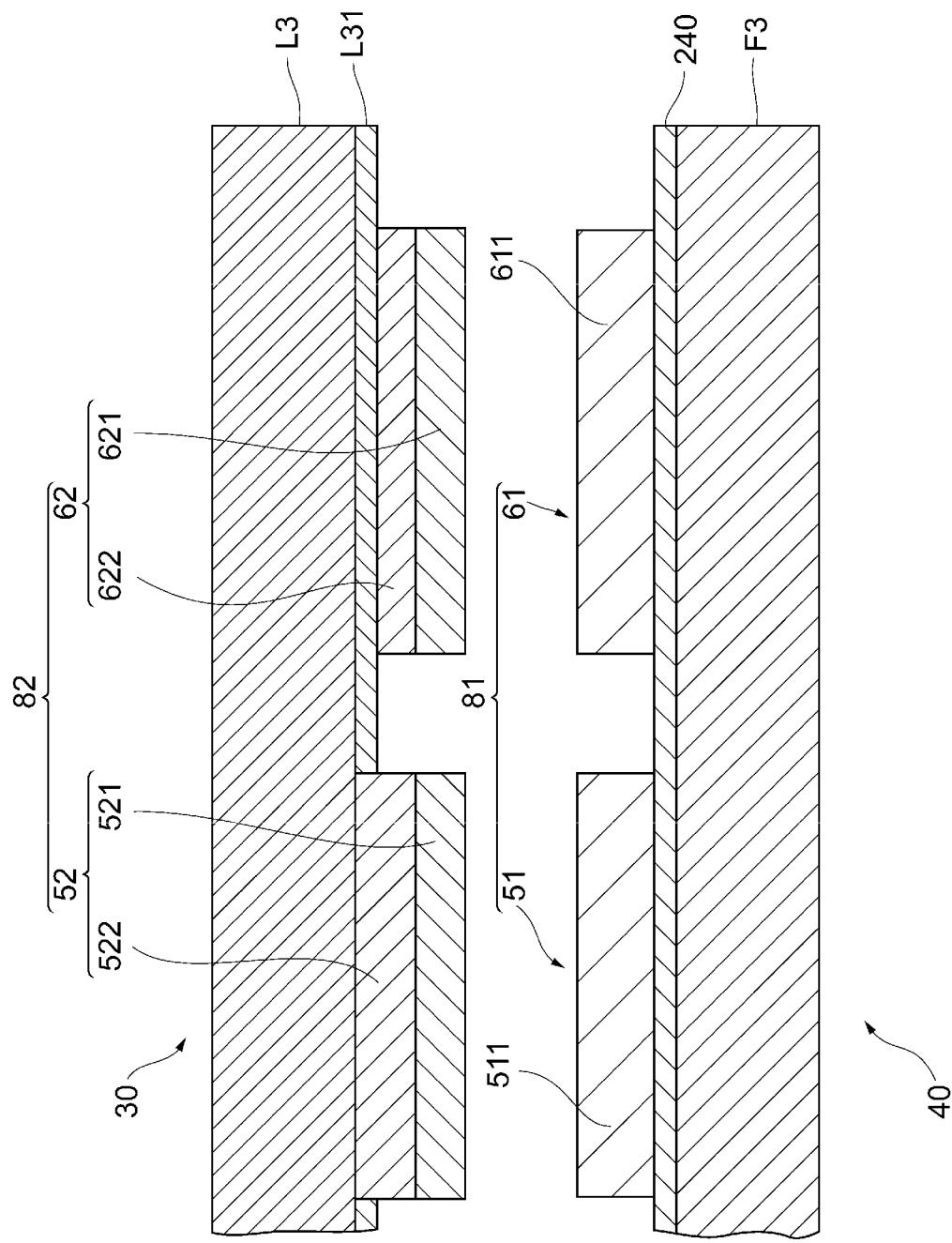
FIG. 10 is a cross-sectional view illustrating a step illustrated in FIG. 7.
Figure 11:
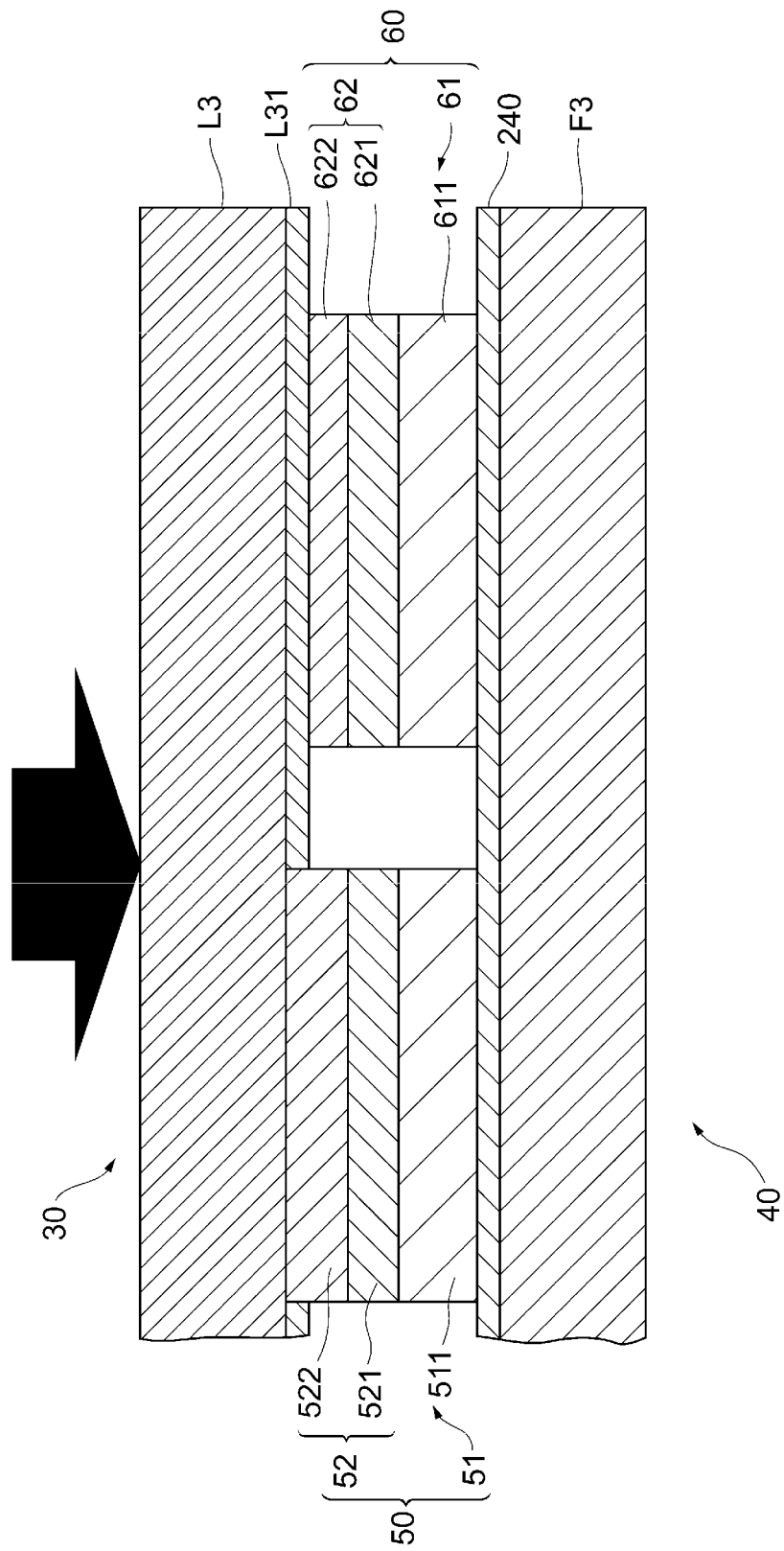
FIG. 11 is a cross-sectional view illustrating a step illustrated in FIG. 7.

Next, a method of manufacturing the resonance device 1 according to an embodiment of the present invention will be described with reference to FIG. 7 to FIG. 11. FIG. 7 is a flowchart illustrating the method of manufacturing the resonance device 1 according to the embodiment of the present invention. FIG. 8 is a cross-sectional view illustrating a step S301 illustrated in FIG. 7. FIG. 9 is a cross-sectional view illustrating a step S302 illustrated in FIG. 7. FIG. 10 is a cross-sectional view illustrating a step S303 illustrated in FIG. 7. FIG. 11 is a cross-sectional view illustrating a step S304 illustrated in FIG. 7. Note that in FIG. 8 to FIG. 11, one resonance device 1 among a plurality of resonance devices 1 manufactured by the manufacturing method will be described for the sake of convenience.

As illustrated in FIG. 7, first, the MEMS substrate 40 and the upper lid 30 are prepared (S301).

Specifically, as illustrated in FIG. 8, the above-described MEMS substrate 40 including the resonator 10 and the upper lid 30 having the through-electrode V3 are each prepared. However, in this case, the connection wiring 70 (see FIG. 4) connecting the through-electrode V3 and the resonator 10 is not yet formed.

Returning to FIG. 7, next, in the MEMS substrate 40 prepared in the step S301, the first metal layer 81 including the first ground portion 51 and the first bonding portion 61 is formed around the vibrating portion 120 of the resonator 10 (S302).

Specifically, as illustrated in FIG. 9, the aluminum layer 511 configuring the first ground portion 51 and the aluminum layer 611 configuring the first bonding portion 61 are simultaneously formed on the prepared MEMS substrate 40 (resonator 10), respectively.

More specifically, first, in the prepared MEMS substrate 40 (resonator 10), for example, aluminum (Al) is laminated on the parasitic capacitance reducing film 240 formed on the piezoelectric thin film F3. Next, by forming the laminated aluminum (Al) into a desired shape by etching or the like, in the MEMS substrate 40, the first metal layer 81, that is, the aluminum layer 511 of the first ground portion 51 and the aluminum layer 611 of the first bonding portion 61 are formed in an outer side portion of the vibrating portion 120. Thus, the first metal layer 81 is formed on the MEMS substrate 40. In addition, the first metal layer 81 is formed around the resonance space of the resonator 10 in a plan view of the MEMS substrate 40. The aluminum layer 511 is formed on an inner side of the aluminum layer 611 without being in contact with the aluminum layer 611.

After the first metal layer 81 is formed, a first annealing treatment (heat treatment) for degassing is performed with respect to the MEMS substrate 40. In addition, the first annealing temperature of the first annealing treatment is, for example, about 450° C.

Here, the first metal layer 81 includes only the aluminum layer 511 and the aluminum layer 611, and each of the aluminum layer 511 and the aluminum layer 611 is prevented from directly being in contact with the MEMS substrate 40 by the parasitic capacitance reducing film 240. Therefore, even when the heat treatment is performed at a high temperature of about 450° C., the influence of thermal diffusion on the MEMS substrate 40 is small. Therefore, by degassing the first metal layer 81 more reliably and effectively, the degree of vacuum of the vibration space S after sealing can be improved.

Returning to FIG. 7, next, in the upper lid 30 prepared in the step S301, when the MEMS substrate 40 and the upper lid 30 are made to face each other, the second metal layer 82 including the second ground portion 52 and the second bonding portion 62 which are continuously provided from the MEMS substrate 40 side is formed (S303).

Specifically, as illustrated in FIG. 10, the titanium layer 522 and the germanium layer 521 configuring the second ground portion 52 and the titanium layer 622 and the germanium layer 621 configuring the second bonding portion 62 are simultaneously formed on the back surface of the prepared upper lid 30.

More specifically, first, for example, titanium (Ti) is laminated on a portion where a part of the silicon oxide film L31 is removed in advance and a portion where the silicon oxide film L31 is not removed on the back surface of the upper lid 30. Next, by forming the laminated titanium (Ti) into a desired shape by etching or the like, in the upper lid 30, the titanium layer 522 in the portion where a part of the silicon oxide film L31 is removed in advance and the titanium layer 622 in the portion where the silicon oxide film L31 is not removed are simultaneously formed. In addition, a predetermined position where the titanium layer 522 and the titanium layer 622 are formed is, for example, a position on the back surface of the upper lid 30 facing or substantially facing the first metal layer 81 formed in the MEMS substrate 40 when the front surface of the MEMS substrate 40 and the back surface of the upper lid 30 are made to face each other.

Then, for example, germanium (Ge) is laminated on each of the titanium layer 522 and the titanium layer 622 (under each of the titanium layer 522 and the titanium layer 622 in FIG. 10) to provide the germanium layer 521 and the germanium layer 621. Thus, the second metal layer 82 is formed at a predetermined position of the upper lid 30.

After the second metal layer 82 is formed, a second annealing treatment (heat treatment) for degassing is performed on the upper lid 30. In addition, the second annealing temperature of the second annealing treatment is the same as the first annealing temperature, and is, for example, about 450° C.

Here, since a material of the upper lid 30 is silicon, the upper lid 30 is more likely to be affected by thermal diffusion generated during annealing treatment than the MEMS substrate 40. In addition, since the second ground portion 52 of the second metal layer 82 is in direct contact with the upper lid 30 without interposing the silicon oxide film L31 therebetween, thermal diffusion to the upper lid 30 is more likely to occur than in a case where an insulating layer such as the silicon oxide film L31 is employed. However, the second metal layer 82 provided in the upper lid 30 includes only the titanium layer 522 and the titanium layer 622, and the germanium layer 521 and the germanium layer 621. That is, the second metal layer 82 does not contain an aluminum component that is likely to thermally diffuse to silicon. Therefore, even when the upper lid 30 is made of a silicon material that is easily affected by the annealing temperature of the annealing treatment, it is possible to avoid thermal diffusion of aluminum into silicon, and there is no need to lower the second annealing temperature. As a result, as the second annealing temperature of the second annealing treatment, for example, a high temperature of about 450° C. can be adopted, similarly to the first annealing temperature.

Note that for example, in a case where aluminum is contained in the second metal layer 82 on the upper lid 30 side made of a silicon material, only about 400° C. as the annealing temperature for degassing the second metal layer 82 can be adopted in order to avoid thermal diffusion of aluminum to silicon. In this case, the degree of vacuum of the vibration space S bonded after annealing treatment at about 400° C. is about 10 Pa. On the other hand, the degree of vacuum of the vibration space S sealed after the annealing treatment at about 450° C. according to the present embodiment is about 1 Pa to 2 Pa. Therefore, the degree of vacuum of the vibration space S after the annealing treatment at about 450° C. is clearly improved as compared with the case of the annealing treatment at about 400° C. That is, performing the annealing treatment at the high temperature of about 450° C. more reliably and effectively degasses the first metal layer 81 and the second metal layer 82 than performing the annealing treatment at the temperature of about 400° C., and thus it is possible to improve the degree of vacuum of the vibration space S after bonding and sealing.

Returning to FIG. 7, next, the MEMS substrate 40 in which the first metal layer 81 is formed in the step S302 and the upper lid 30 in which the second metal layer 82 is formed in the step S303 are bonded to each other so as to seal the vibration space S of the resonator 10 (S304). This step S304 includes forming the bonding portion 60 and the ground portion 50, that is, the eutectic reaction layer 80, including a eutectic alloy (AlGeTi alloy) of the first metal layer 81 containing aluminum (Al) as a main component and the second metal layer 82 containing germanium (Ge) and titanium (Ti) of a third metal as a main component.

Specifically, the positions of the MEMS substrate 40 and the upper lid 30 are aligned so that the first metal layer 81 and the second metal layer 82 coincide with each other. After the alignment, the MEMS substrate 40 and the upper lid 30 are sandwiched by a heater or the like, and heat treatment for ternary eutectic reaction is performed. At this time, the upper lid 30 is moved toward the MEMS substrate 40. As a result, as illustrated in FIG. 11, the germanium layer 521 of the second metal layer 82 is in contact with the aluminum layer 511 of the first metal layer 81.

The eutectic temperature in the heat treatment for the ternary eutectic reaction is preferably equal to or higher than the temperature of the eutectic point and lower than the melting point in a case of aluminum (Al) alone of the first metal. That is, in a case where the second metal is germanium (Ge) and the third metal is titanium (Ti), the temperature is preferably equal to or higher than 422° C., which is the eutectic point, and lower than about 620° C., which is the melting point of aluminum (Al) alone.

In addition, the heating time is preferably about 5 minutes to 30 minutes. In the present embodiment, the heat treatment of the eutectic reaction is performed at about 440° C. as a eutectic temperature for about 15 minutes as a heating time.

At the time of heating, the upper lid 30 and the MEMS substrate 40 are pressed from the upper lid 30 to the MEMS substrate 40 as indicated by a black arrow in FIG. 11. The pressing force is, for example, about 15 Mpa, and is preferably about 5 MPa to 25 MPa.

In addition, after the heat treatment for the ternary eutectic reaction, a cooling treatment is performed by natural cooling, for example. Note that, the cooling treatment is not limited to natural cooling, and various cooling temperatures and cooling speeds can be selected as long as a eutectic layer 65 containing a eutectic alloy as a main component can be formed in the bonding portion 60.

As a result of performing the step S304 illustrated in FIG. 7, the ground portion 50 and the bonding portion 60 (see FIG. 4 and FIG. 5) are formed.

In addition, an aluminum (Al) film may be formed when forming the first metal layer 81, a germanium (Ge) film may be formed when forming the second metal layer 82, and these layers are eutectic-bonded, whereby the connection wiring 70 (see FIG. 4) for connecting the through-electrode V3 and the resonator 10 may be provided.

As described above, the present embodiment adopts a configuration in which the aluminum layer is not provided but only the germanium layer and the titanium layer are provided in the upper lid 30 that is easily affected by the heat of the annealing treatment, and the aluminum layer is provided in the MEMS substrate 40 that is hardly affected by the heat of the annealing treatment. With such a configuration, even when the upper lid 30 is easily affected by the heat of the annealing treatment, thermal diffusion to the upper lid 30 due to aluminum does not occur when the annealing treatment is performed, therefore, it is not necessary to lower the annealing temperature. Therefore, an annealing temperature at which the germanium layer and the titanium layer provided in the upper lid 30 can be sufficiently degassed can be adopted, and the degree of vacuum can be improved. In addition, the thermal diffusion of aluminum has little influence on the MEMS substrate 40. Therefore, even when an aluminum layer is provided in the MEMS substrate 40, an annealing temperature at which the aluminum layer can be sufficiently degassed can be adopted. As a result, the first metal layer 81 (containing aluminum as a main component) and the second metal layer 82 (containing germanium and titanium as main components) can be reliably and effectively degassed, and the degree of vacuum vibration space S after sealing can be improved.

In addition, in the present embodiment, an alloy layer can be formed by causing aluminum (Al), germanium (Ge), and titanium (Ti) to have the eutectic reaction. Therefore, as compared with a structure in which an alloy layer is not easily formed, formation of an interface of different materials can be suppressed, problems such as voids, interface peeling and the like due to an interface of different materials can be reduced, and airtightness of bonding and bonding strength can be improved.

Further, in the present embodiment, by expanding the eutectic reaction layer to the inside of the upper lid 30, the aluminum component can be diffused into the inside of the upper lid 30. Therefore, the upper lid 30 is grounded by the aluminum component diffused inside the upper lid 30, and reduction in the contact resistance of the upper lid 30 is achieved.

[Modification]

The present invention is not limited to the above-described embodiment and can be variously modified and applied. Hereinafter, modifications according to the present invention will be described.

(First Modification)

Figure 12:
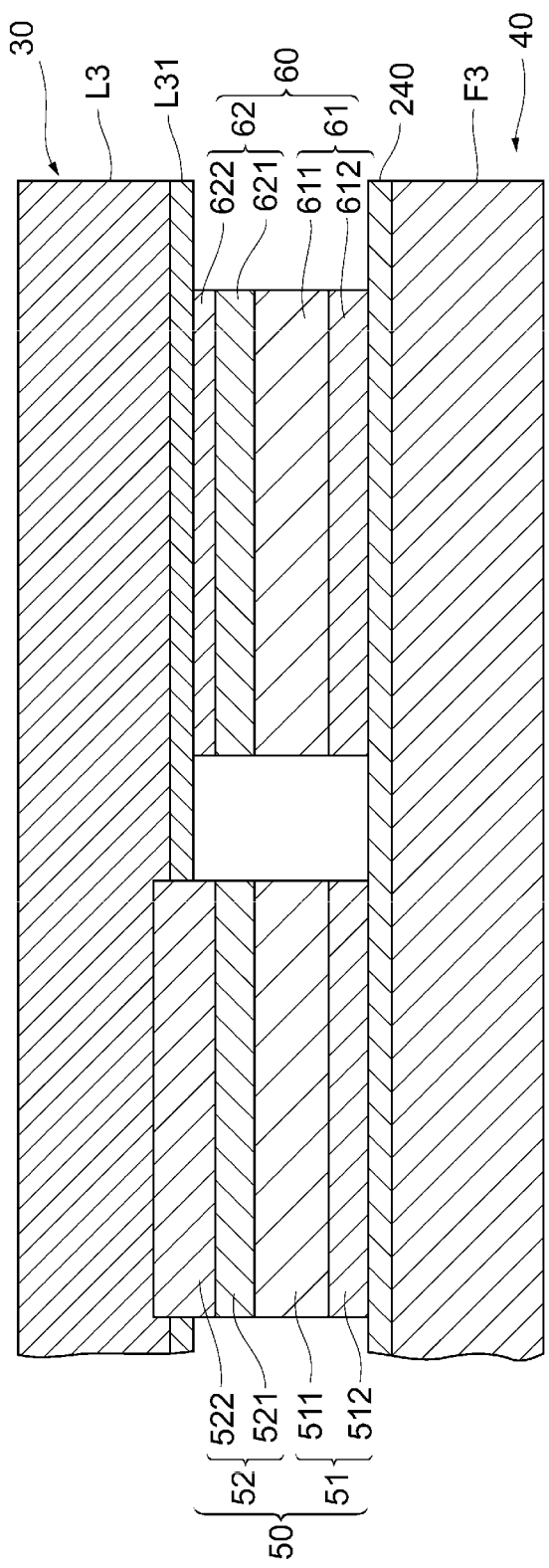
FIG. 12 is an enlarged cross-sectional view of a main part illustrating a first modification of a bonding portion illustrated in FIG. 5.

FIG. 12 is an enlarged cross-sectional view of a main part illustrating a first modification of the ground portion 50 and the bonding portion 60 illustrated in FIG. 5. Note that, in the first modification, the same components as those of the ground portion 50 and the bonding portion 60 illustrated in FIG. 5 are denoted by the same reference numerals, and the description thereof will be appropriately omitted. In addition, the same operation and effect by the same configuration will not be sequentially described. Note that, since the bonding portion 60 has the same components as the ground portion 50, the following description will focus on the configuration of the ground portion 50, and the description of the bonding portion 60 will be omitted. Note that, the same applies to a second modification, a third modification, and the like, which will be described later.

As illustrated in FIG. 12, the first ground portion 51 further includes a titanium layer 512 formed on the MEMS substrate 40 side. The aluminum layer 511 is provided on the titanium layer 512.

Similarly to the titanium layer 522 provided on the upper lid 30 side, the titanium layer 512 has a function as a close contact layer, and can improve a property of close contact between the ground portion 50 and the MEMS substrate 40. Therefore, the bonding strength of the ground portion 50 can be further improved. The same applies to the bonding portion 60.

In a manufacturing method of the first modification, the titanium layer 512 and the aluminum layer 511 are continuously provided from the MEMS substrate 40 side in the step S302 illustrated in FIG. 9.

In addition, in the step S304 according to the first modification, the ternary eutectic reaction is the same as in the above-described example.

(Second Modification)

Figure 13:
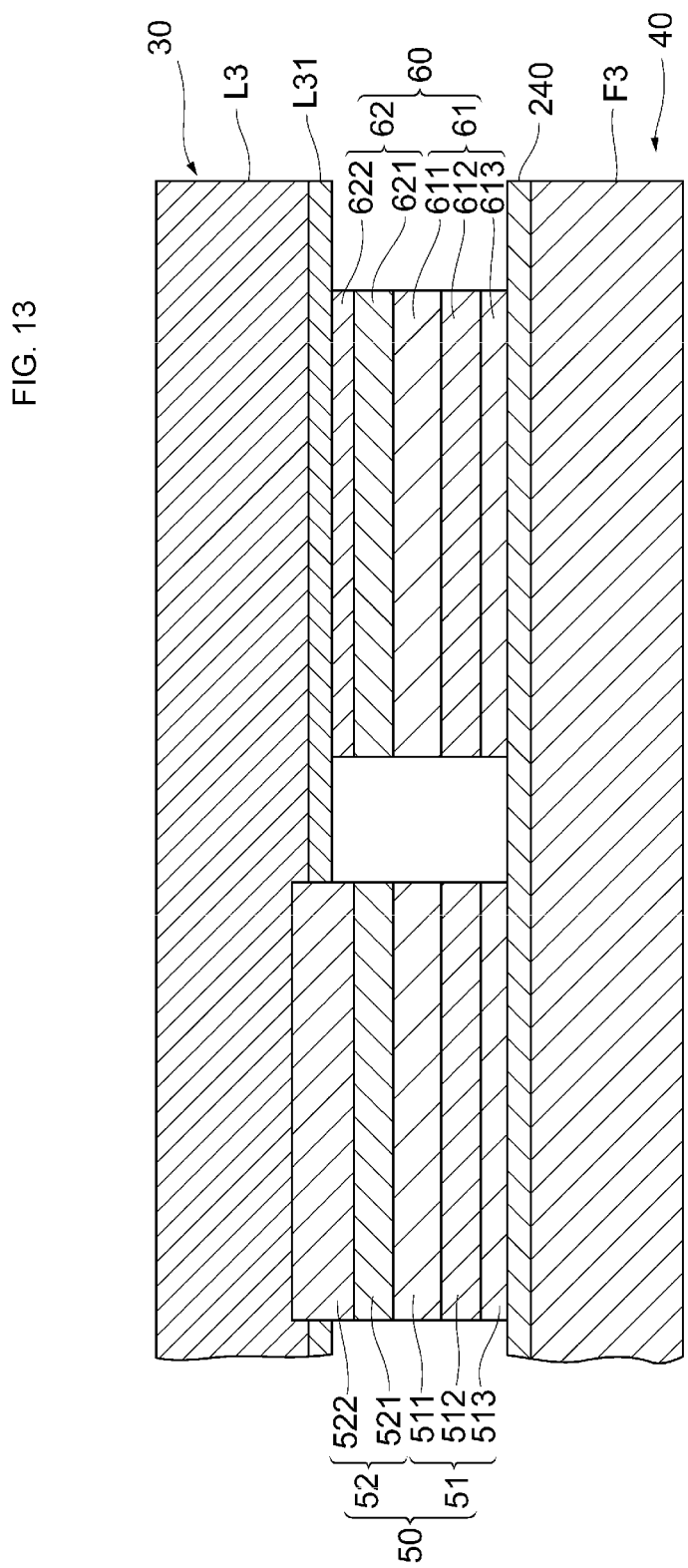
FIG. 13 is an enlarged cross-sectional view of a main part illustrating a second modification of the bonding portion illustrated in FIG. 5.

FIG. 13 is an enlarged cross-sectional view of a main part illustrating a second modification of the ground portion 50 and the bonding portion 60 illustrated in FIG. 5. The first ground portion 51 includes the aluminum layer 511 and the titanium layer 512 according to the first modification, and further includes an aluminum layer 513 provided beneath the titanium layer 512. That is, the first ground portion 51 according to the second modification has a laminated structure of aluminum-titanium-aluminum.

By employing the above aluminum layer 513, wiring can be lead out from the aluminum layer 513 in the MEMS substrate 40.

In addition, a material of the aluminum layer 513 preferably contains an aluminum-copper alloy (AlCu alloy) or an aluminum-silicon-copper alloy (AlSiCu alloy) as a main component other than the case where aluminum (Al) is contained as a main component. Accordingly, the aluminum layer 513 has conductivity, the manufacturing process can be simplified, and the ground portion 50 that seals the vibration space S of the resonator 10 can be easily formed. The same applies to the bonding portion 60.

In a manufacturing method of the second modification, the aluminum layer 513, the titanium layer 512, and the aluminum layer 511 are continuously provided from the MEMS substrate 40 side in the step S302 illustrated in FIG. 9.

In addition, in the step S304 according to the second modification, the ternary eutectic reaction is the same as in the above-described example.

(Third Modification)

Figure 14:
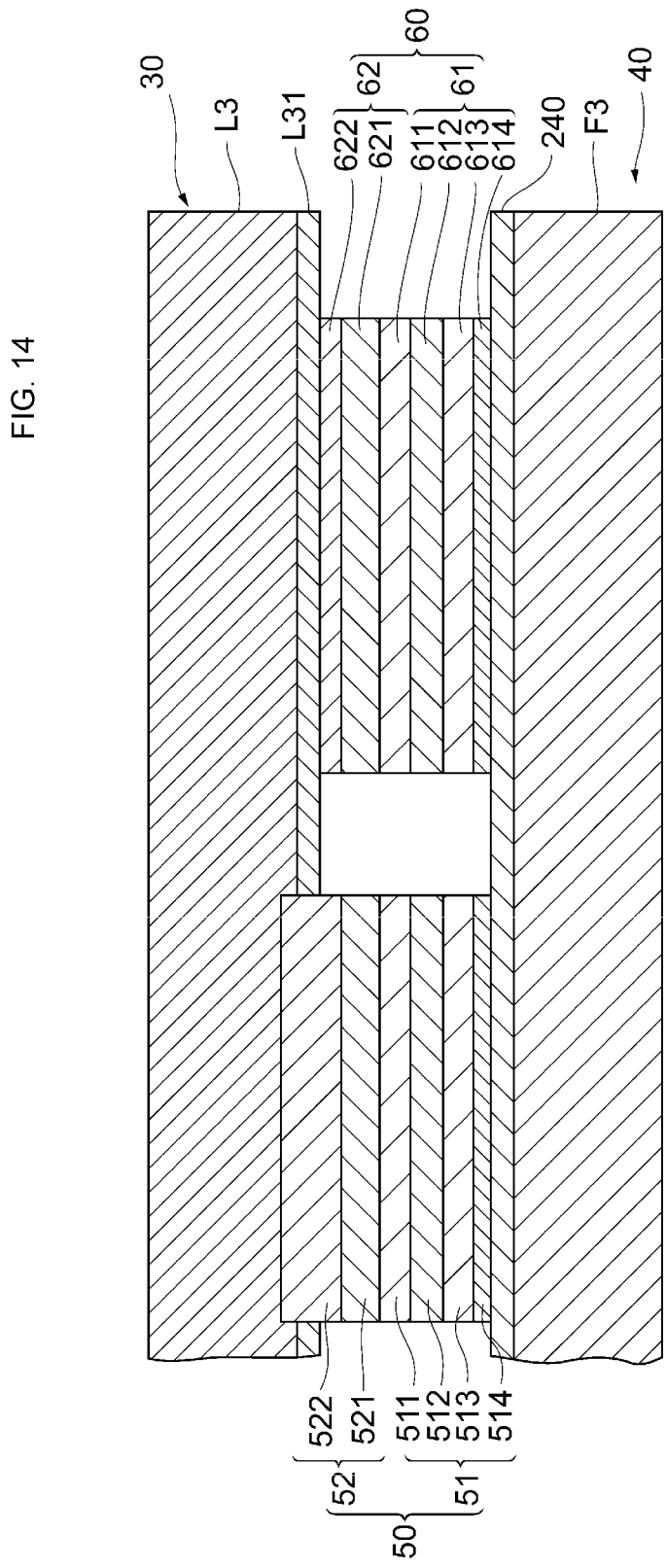
FIG. 14 is an enlarged cross-sectional view of a main part illustrating a third modification of the bonding portion illustrated in FIG. 5.

FIG. 14 is an enlarged cross-sectional view of a main part illustrating a third modification of the ground portion 50 and the bonding portion 60 illustrated in FIG. 5. The first ground portion 51 includes the aluminum layer 511, the titanium layer 512, and the aluminum layer 513 according to the second modification, and further includes the titanium layer 514 provided beneath the aluminum layer 513. That is, the first ground portion 51 according to the third modification has a laminated structure of aluminum-titanium-aluminum-titanium.

As described above, the titanium layer functioning as the close contact layer is provided between the aluminum layer and the aluminum layer and also between the aluminum layer and the MEMS substrate 40. Therefore, the bonding strength of the ground portion 50 can be further improved as compared with the first modification and the second modification. The same applies to the bonding portion 60.

In a manufacturing method of the third modification, the titanium layer 514, the aluminum layer 513, the titanium layer 512, and the aluminum layer 511 are continuously provided from the MEMS substrate 40 side in the step S302 illustrated in FIG. 9.

In addition, in the step S304 according to the third modification, the ternary eutectic reaction is the same as in the above-described example.

(Other Modifications)

In the above-described embodiment, although the ground portion 50 and the bonding portion 60 are described as eutectic reaction layers (eutectic alloy layers) formed by a ternary or higher-order eutectic reaction, the present invention is not limited to the above-described configuration. For example, the ground portion 50 and the bonding portion 60 may be a eutectic reaction layer (eutectic alloy layer) configured by a first metal containing aluminum (Al) as a main component and a second metal containing germanium (Ge) as a main component. That is, the ground portion 50 and the bonding portion 60 may be formed by a binary eutectic reaction.

However, in a case where two elements, for example, aluminum (Al), and germanium (Ge) are made to have a eutectic reaction and bonded, an aluminum-germanium alloy (AlGe alloy) is hardly formed, and an aluminum (Al) single layer and a germanium (Ge) single layer are formed. As a result, there are many interfaces between the aluminum (Al) single layer and the germanium (Ge) single layer. At the interface between such different materials, voids or peeling (interface peeling) is likely to occur due to the difference in thermal stress, and the airtightness and bonding strength of the bonding portion may decrease. Therefore, it is preferable to employ a ternary or higher-order eutectic reaction capable of forming an alloy layer.

In the above-described embodiment, the ground portion 50 and the bonding portion 60 are described as eutectic reaction layers (eutectic alloy layers) generated by the eutectic reaction of aluminum (Al), germanium (Ge), and titanium (Ti), but the present invention is not limited to the above-described configuration. For example, a eutectic reaction layer (eutectic alloy layer) formed by a eutectic reaction of aluminum (Al), germanium (Ge), and nickel (Ni), a eutectic reaction of aluminum (Al), silicon (Si), and titanium (Ti), and a eutectic reaction of aluminum (Al), silicon (Si), and nickel (Ni) may be used. In addition, in these cases, a liquid of eutectic molten metal and an alloy are generated.

In the above embodiment, the first annealing temperature and the second annealing temperature are about 450° C., but are not limited thereto. For example, the annealing temperature may be changed by changing the metal of the eutectic reaction. In addition, the first annealing temperature and the second annealing temperature may be different from each other. In addition, similarly, the eutectic temperature has been described as being about 440° C., but is not limited thereto. For example, the eutectic temperature may be changed by changing the metal of the eutectic reaction.

In the above-described embodiment and the first to third modifications, the ground portion 50 and the bonding portion 60 have the same components, but the present invention is not limited to the above-described configuration. For example, the ground portion 50 and the bonding portion 60 may have different components.

Exemplary embodiments of the present invention have been described above.

A resonance device according to an embodiment of the present invention includes the MEMS substrate 40 which is an example of a first substrate including the resonator 10, the upper lid 30 which is an example of a second substrate provided so as to seal the vibration space S of the resonator 10, and the ground portion 50 which is an example of a first eutectic reaction layer positioned between the MEMS substrate 40 and the upper lid 30, extended to an inside of the upper lid 30, and electrically connected to the upper lid 30. As a result, reduction in the contact resistance of the substrate can be achieved, and an excellent degree of vacuum can be obtained by suppressing the occurrence of outgassing.

In addition, in the above-described resonance device, the parasitic capacitance reducing film 240, which is an example of an insulating layer, may be provided on substantially the entire surface of the resonator 10 of the upper lid 30, and the ground portion 50 may be electrically connected to the upper lid 30 so as to ground the upper lid 30 and may be connected to the MEMS substrate 40 in an insulating manner with the parasitic capacitance reducing film 240 interposed therebetween. As a result, it is possible to ground the substrate and achieve reduction in the contact resistance in the substrate.

In addition, in the resonance device described above, the material of the upper lid 30 may be silicon. Thus, the contact resistance of the silicon substrate can be reduced.

In addition, in the above-described resonance device, the main component of the ground portion 50 may include aluminum and germanium. Thus, the contact resistance of the silicon substrate can be reduced more effectively by employing aluminum, which is a material suitable for reducing the ground/contact resistance with the silicon substrate.

In addition, in the above-described resonance device, the main component of the ground portion 50 may further include titanium, and the ground portion 50 may be an alloy layer containing a eutectic reaction product of the aluminum, the germanium, and the titanium. Thus, formation of an interface of different materials can be suppressed.

In addition, in the above-described resonance device, the ground portion 50 may be formed such that the concentration of aluminum on the upper lid 30 side is lower than the concentration of aluminum on the MEMS substrate 40 side, or the concentration of aluminum on the upper lid 30 substrate side is the same as the concentration of aluminum on the MEMS substrate 40 side. As such, the influence of thermal diffusion of aluminum on the substrate can be reduced.

In addition, the above-described resonance device may further include the bonding portion 60 that bonds the MEMS substrate 40 and the upper lid 30 and is an example of a second eutectic reaction layer, and the bonding portion 60 may be positioned on the outer peripheral side of the ground portion 50 and may be connected to each of the MEMS substrate 40 and the upper lid 30 in an insulating manner via the parasitic capacitance reducing film 240 and the silicon oxide film L31, respectively. Thus, the degree of vacuum can be improved.

In addition, in the above-described resonance device, the bonding portion 60 may have the same component as the ground portion 50. Thus, by having the same components, manufacturing is simplified and productivity can be improved.

In addition, the degree of vacuum of the vibration space S may be 1 Pa to 2 Pa. Thus, a good degree of vacuum can be obtained.

A resonance device manufacturing method according to an embodiment of the present invention includes preparing the MEMS substrate 40 including the resonator 10, and the upper lid 30 capable of sealing the vibration space S of the resonator 10, forming the first metal layer 81 around the vibrating portion 120 of the resonator 10 in the MEMS substrate 40, forming the second metal layer 82 having a component different from that of the first ground portion 51 at a position of the upper lid 30 facing the first ground portion 51, and bonding the MEMS substrate 40 and the upper lid 30 together, in the bonding, the first ground portion 51 of the first metal layer 81 and the second ground portion 52 of the second metal layer 82 have the eutectic reaction to generate the ground portion 50, and the ground portion 50 is extended to an inside of the upper lid 30 and is electrically connected to the upper lid 30. As a result, the contact resistance of the substrate can be reduced, and an excellent degree of vacuum can be obtained by suppressing the occurrence of outgassing.

In addition, in the above-described resonance device manufacturing method, the ground portion 50 may be positioned between the MEMS substrate 40 and the upper lid 30, a portion of the ground portion 50 on the upper lid 30 side may be extended to an inside of the upper lid 30 and electrically connected to the upper lid 30 so as to ground the upper lid 30, and a portion of the ground portion 50 on the MEMS substrate 40 may be connected to the MEMS substrate 40 in an insulating manner via the parasitic capacitance reducing film 240 provided on the MEMS substrate 40. As a result, it is possible to ground the substrate and achieve reduction in the contact resistance in the substrate.

In addition, in the above-described resonance device manufacturing method, the material of the upper lid 30 may be silicon, the first ground portion 51 may include at least an aluminum layer, and the second ground portion 52 may include at least a germanium layer. Thus, reduction in the contact resistance in the substrate can be achieved.

In addition, in the above-described resonance device manufacturing method, the thickness of the aluminum layer may be about 0.70 μm, and the thickness of the germanium layer may be about 0.38 μm. Thus, the eutectic reaction layer can be sufficiently generated.

In addition, in the above-described resonance device manufacturing method, the second ground portion 52 may further include a titanium layer, the titanium layer may be provided closer to the upper lid 30 side than the germanium layer, and the ground portion 50 may be an alloy layer containing a eutectic reaction product of the aluminum, the germanium, and the titanium. Thus, formation of an interface of different materials can be suppressed.

In addition, in the above-described resonance device manufacturing method, the thickness of the titanium layer may be about 0.10 μm. Thus, the property of close contact of the bonding can be improved.

In addition, the above-described resonance device manufacturing method may further include a first annealing treatment for degassing the first ground portion 51 of the MEMS substrate 40 and a second annealing treatment for degassing the second ground portion 52 of the upper lid 30, and the first annealing treatment and the second annealing treatment may be performed before the bonding is performed. Thus, a good degree of vacuum can be obtained.

In addition, in the above-described resonance device manufacturing method, the annealing temperature of each of the first annealing treatment and the second annealing treatment may be about 450° C. Thus, the degree of vacuum can be improved by performing sufficient degassing.

In addition, in the above-described resonance device manufacturing method, the eutectic temperature for having the eutectic reaction in the bonding may be about 440° C. Thus, the eutectic reaction layer can be sufficiently generated.

In addition, in the above-described resonance device manufacturing method, when viewed in a plan view, the first metal layer 81 may include the first bonding portion 61 positioned around a vibrating portion of a first substrate and the first ground portion 51 positioned on an inner side of the first bonding portion without being in contact with the first bonding portion, when viewed in a plan view, the second metal layer 82 may include the second bonding portion 62 at a position facing the first bonding portion 61 and the second ground portion 52 at a position facing the first ground portion 51 when the MEMS substrate 40 and the upper lid 30 are made to face each other, and the bonding may include causing the first bonding portion 61 and the second bonding portion 62 to have a eutectic reaction and generating a bonding portion 60 and causing the first ground portion 51 and the second ground portion 52 to have a eutectic reaction and generating a ground portion 50, in which the ground portion 50 may be a first eutectic reaction layer and the bonding portion 60 may be a second eutectic reaction layer having the same component as that of the first eutectic reaction layer. As a result, it is possible to ground the substrate and achieve reduction in the contact resistance in the substrate.

In addition, in the above-described resonance device manufacturing method, the bonding portion 60 may be positioned between the MEMS substrate 40 and the upper lid 30, and may be connected to the MEMS substrate 40 and the upper lid 30 in an insulating manner without being extended to an inside of the MEMS substrate 40 and the upper lid 30 by the parasitic capacitance reducing film 240 and the silicon oxide film L31 provided in the MEMS substrate 40 and the upper lid 30, respectively. Thus, a good degree of vacuum can be obtained.

Note that the embodiments described above are intended to facilitate understanding of the present invention, and are not intended to limit the interpretation of the present invention. The present invention can be modified/improved without departing from the spirit thereof, and the present invention includes equivalents thereof. In other words, embodiments obtained by applying appropriate design changes to each embodiment by those skilled in the art are also included in the scope of the present invention as long as they have the features of the present invention. For example, each element included in the embodiment and the arrangement, material, condition, shape, size, and the like thereof are not limited to those exemplified, and can be appropriately changed. In addition, the embodiment is an example, and it is needless to say that partial replacement or combination of configurations illustrated in different embodiments is possible, and these are also included in the scope of the invention as long as they include the features of the invention.

REFERENCE SIGNS LIST

1 RESONANCE DEVICE
10 RESONATOR
20 LOWER LID
21 RECESS
22 BOTTOM PLATE
23 SIDE WALL
30 UPPER LID
31 RECESS
33 SIDE WALL
34 GETTER LAYER
40 MEMS SUBSTRATE
50 GROUND PORTION
60 BONDING PORTION
66 FIRST CONDUCTIVE LAYER
67 SECOND CONDUCTIVE LAYER
68 FIRST CLOSE CONTACT LAYER
69 SECOND CLOSE CONTACT LAYER
70 CONNECTION WIRING
76A, 76B CONTACT ELECTRODE
80 EUTECTIC REACTION LAYER
90 SECOND LAYER
110 HOLDING ARM
120 VIBRATING PORTION
130 BASE PORTION
131a LONG SIDE
131A FRONT END
131b LONG SIDE
131B REAR END
131c SHORT SIDE
131d SHORT SIDE
135, 135A, 135B, 135C, 135D VIBRATING ARM
140 HOLDING PORTION
141 VOLTAGE APPLICATION PORTION
235 PROTECTIVE FILM
236 FREQUENCY ADJUSTMENT FILM
240 PARASITIC CAPACITANCE REDUCING FILM
E1, E2 METALLIC LAYER
F2 Si SUBSTRATE
F3 PIEZOELECTRIC THIN FILM
F21 SILICON OXIDE LAYER
G WEIGHT PORTION
L1 WAFER
L3 Si WAFER
L31 SILICON OXIDE FILM
P VIRTUAL PLANE
T4 TERMINAL
V1, V2 VIA
V3 THROUGH-ELECTRODE

The invention claimed is:

1. A resonance device comprising:
a first substrate including a resonator;
a second substrate sealed to the first substrate so as to define a vibration space of the resonator;
a first eutectic reaction layer between the first substrate and the second substrate, the first eutectic reaction layer extending to an inside of the second substrate and electrically connected to the second substrate; and
an insulating layer on a substantially entire surface of the resonator of the first substrate, wherein
the first eutectic reaction layer grounds the second substrate, and is connected to the first substrate with the insulating layer interposed between the first eutectic reaction layer and the first substrate.

2. The resonance device according to claim 1, wherein a degree of vacuum of the vibration space is 1 Pa to 2 Pa.

3. The resonance device according to claim 1, wherein a material of the second substrate is silicon.

4. A resonance device comprising:
a first substrate including a resonator;
a second substrate sealed to the first substrate so as to define a vibration space of the resonator; and
a first eutectic reaction layer between the first substrate and the second substrate, the first eutectic reaction layer extending to an inside of the second substrate and electrically connected to the second substrate,
wherein a main component of the first eutectic reaction layer includes aluminum and germanium.

5. The resonance device according to claim 4, wherein the main component of the first eutectic reaction layer further includes titanium, and
the first eutectic reaction layer is an alloy layer containing a eutectic reaction product of the aluminum, the germanium, and the titanium.

6. The resonance device according to claim 4, wherein, in the first eutectic reaction layer, a first concentration of the aluminum on the second substrate side is lower than or equal to a second concentration of the aluminum on the first substrate side.

7. A resonance device comprising:
a first substrate including a resonator;
a second substrate sealed to the first substrate so as to define a vibration space of the resonator;
a first eutectic reaction layer between the first substrate and the second substrate, the first eutectic reaction layer extending to an inside of the second substrate and electrically connected to the second substrate;
a second eutectic reaction layer that bonds the first substrate and the second substrate to each other;
a first insulating layer on a surface of the first substrate; and
a second insulating layer on a surface of the second substrate,
wherein the second eutectic reaction layer is positioned on an outer peripheral side of the first eutectic reaction layer, and is connected to the first substrate via the first insulating layer and is connected to the second substrate via the second insulating layer.

8. The resonance device according to claim 7, wherein the second eutectic reaction layer has the same component as the first eutectic reaction layer.

* * * * *